(12) United States Patent
Jung et al.

(10) Patent No.: US 11,810,900 B2
(45) Date of Patent: Nov. 7, 2023

(54) SEMICONDUCTOR PACKAGES STACKED BY WAFER BONDING PROCESS AND METHODS OF MANUFACTURING THE SEMICONDUCTOR PACKAGES

(71) Applicant: Samsung Electronics Co., Ltd., Suwon-si (KR)

(72) Inventors: Eunsuk Jung, Hwaseong-si (KR); Hyoukyung Cho, Seoul (KR); Jinnam Kim, Anyang-si (KR); Hyungjun Jeon, Seoul (KR); Kwangjin Moon, Hwaseong-si (KR); Hoonjoo Na, Seoul (KR); Hakseung Lee, Seoul (KR)

(73) Assignee: Samsung Electronics Co., Ltd.

( * ) Notice: Subject to any disclaimer, the term of this patent is extended or adjusted under 35 U.S.C. 154(b) by 56 days.

(21) Appl. No.: 17/209,801

(22) Filed: Mar. 23, 2021

(65) Prior Publication Data

US 2022/0013503 A1    Jan. 13, 2022

(30) Foreign Application Priority Data

Jul. 13, 2020 (KR) ......................... 10-2020-0086256

(51) Int. Cl.
*H01L 25/065* (2006.01)
*H01L 23/31* (2006.01)
*H01L 23/00* (2006.01)

(52) U.S. Cl.
CPC ...... *H01L 25/0657* (2013.01); *H01L 23/3128* (2013.01); *H01L 24/08* (2013.01); *H01L 2224/08146* (2013.01)

(58) Field of Classification Search
CPC .............. H01L 25/0657; H01L 24/08; H01L 2224/08146; H01L 24/09; H01L 2224/16225; H01L 2224/80895; H01L 2224/9202; H01L 2224/94; H01L 2225/06517; H01L 2225/06541; H01L 23/481; H01L 24/06
See application file for complete search history.

(56) References Cited

U.S. PATENT DOCUMENTS

| | | | |
|---|---|---|---|
| 7,126,212 B2 | 10/2006 | Enquist et al. | |
| 8,697,542 B2 | 4/2014 | Pascual et al. | |
| 8,779,599 B2 | 7/2014 | Lin et al. | |
| 8,802,499 B2 | 8/2014 | Kelly et al. | |

(Continued)

FOREIGN PATENT DOCUMENTS

| | | | | |
|---|---|---|---|---|
| JP | 6429388 B2 | 11/2018 | | |
| KR | 20160112989 A | 9/2016 | | |
| WO | WO-2021145940 A1 * | 7/2021 | ........... | H01L 23/481 |

*Primary Examiner* — Mamadou L Diallo
(74) *Attorney, Agent, or Firm* — Myers Bigel, P.A.

(57) ABSTRACT

A semiconductor package includes first to fourth semiconductor chips sequentially stacked on one another. A backside of a third substrate of the third semiconductor chip may be arranged to face a backside surface of a second substrate of the second semiconductor chip such that the third substrate and a second backside insulation layer provided on the backside surface of the second substrate are bonded directly to each other, or the backside of the third substrate may be arranged to face a front surface of the second substrate such that the third substrate and a second front insulation layer provided on the front surface of the second substrate are bonded directly to each other.

18 Claims, 24 Drawing Sheets

(56) References Cited

U.S. PATENT DOCUMENTS

| | | | |
|---|---|---|---|
| 9,496,255 B2 | 11/2016 | Zuo et al. | |
| 9,881,904 B2 | 1/2018 | Das et al. | |
| 10,229,897 B2 | 3/2019 | Das | |
| 10,354,987 B1* | 7/2019 | Mushiga | H01L 27/0688 |
| 10,515,933 B2 | 12/2019 | Chang et al. | |
| 11,004,833 B1* | 5/2021 | Kandala | H01L 25/0657 |
| 11,380,598 B2* | 7/2022 | Chen | H01L 25/50 |
| 11,380,614 B2* | 7/2022 | Chen | H01L 27/10805 |
| 2007/0207592 A1 | 9/2007 | Lu et al. | |
| 2010/0159643 A1 | 6/2010 | Takahashi et al. | |
| 2013/0119552 A1 | 5/2013 | Lin et al. | |
| 2016/0155724 A1* | 6/2016 | Kim | H01L 21/6835 |
| | | | 257/774 |
| 2016/0155725 A1* | 6/2016 | Chen | H01L 24/03 |
| | | | 257/770 |
| 2017/0154873 A1* | 6/2017 | Kim | H01L 27/1464 |
| 2017/0200756 A1* | 7/2017 | Kao | H01L 27/14636 |
| 2019/0043831 A1* | 2/2019 | Yoo | H01L 25/0657 |
| 2020/0058617 A1* | 2/2020 | Wu | H01L 24/33 |
| 2020/0161242 A1* | 5/2020 | Lin | H01L 25/0652 |
| 2021/0091064 A1* | 3/2021 | Chen | H01L 24/06 |
| 2021/0134694 A1* | 5/2021 | Li | H01L 24/80 |
| 2021/0134760 A1* | 5/2021 | Gaide | H01L 25/0657 |
| 2021/0265313 A1* | 8/2021 | Chen | H01L 21/56 |
| 2021/0407942 A1* | 12/2021 | Yu | H01L 24/19 |
| 2022/0068745 A1* | 3/2022 | Li | H01L 27/0688 |
| 2022/0197329 A1* | 6/2022 | Gaide | H01L 25/0657 |
| 2022/0208735 A1* | 6/2022 | Yu | H01L 27/10897 |

\* cited by examiner

SEMICONDUCTOR PACKAGES STACKED BY WAFER BONDING PROCESS AND METHODS OF MANUFACTURING THE SEMICONDUCTOR PACKAGES

CROSS-REFERENCE TO RELATED APPLICATION

This application claims priority under 35 U.S.C. § 119 to Korean Patent Application No. 10-2020-0086256, filed on Jul. 13, 2020, in the Korean Intellectual Property Office (KIPO), the contents of which are herein incorporated by reference in their entirety.

BACKGROUND

1. Field

Aspects of the present disclosure relate to semiconductor packages and to methods of manufacturing the semiconductor packages. More particularly, aspects of the present disclosure relate to semiconductor packages including semiconductor chips stacked by a wafer bonding process and to methods of manufacturing the same.

2. Description of the Related Art

As part of manufacturing a multi-chip package in which at least four semiconductor chips are stacked, a wafer-to-wafer bonding process may be performed. However, in the wafer-to-wafer bonding process, there may be a problem in that the bonding yield may be lowered, and when another wafer is bonded on a previously bonded wafer, the bonding interface may be limited by the interface of the previously bonded wafer.

SUMMARY

Some example embodiments according to the present inventive concepts provide semiconductor packages having a thin or reduced thickness and a stacked structure that may improve the yield of a wafer bonding process.

Some example embodiments according to the present inventive concepts provide methods of manufacturing the semiconductor packages.

According to some example embodiments, a semiconductor package includes a first semiconductor chip including a first substrate and a front insulation layer on a front surface of the first substrate and having a first bonding pad in an outer surface thereof; a second semiconductor chip stacked on the first semiconductor chip, the second semiconductor chip including a second substrate, a second front insulation layer on a front surface of the second substrate and having a third bonding pad in an outer surface thereof, and a second backside insulation layer on a backside surface of the second substrate and having a fourth bonding pad in an outer surface thereof; a third semiconductor chip stacked on the second semiconductor chip, the third semiconductor chip including a third substrate, a third front insulation layer on a front surface of the third substrate and having a fifth bonding pad in an outer surface thereof, and a through electrode penetrating through the third substrate to be electrically connected to the fifth bonding pad; and a fourth semiconductor chip stacked on the third semiconductor chip, the fourth semiconductor chip including a fourth substrate and a fourth front insulation layer on a front surface of the fourth substrate and having a seventh bonding pad in an outer surface thereof. A backside of the third substrate is arranged to face the backside surface of the second substrate such that the third substrate and the second backside insulation layer are bonded directly to each other, or the backside of the third substrate is arranged to face the front surface of the second substrate such that the third substrate and the second front insulation layer are bonded directly to each other.

According to some example embodiments, a semiconductor package includes a first semiconductor chip including a first substrate and a front insulation layer on a front surface of the first substrate; a second semiconductor chip stacked on the first semiconductor chip, the second semiconductor chip including a second substrate, a second front insulation layer on a front surface of the second substrate, and a second backside insulation layer on a backside surface of the second substrate; a third semiconductor chip stacked on the second semiconductor chip, the third semiconductor chip including a third substrate, a third front insulation layer on a front surface of the third substrate, and a through electrode penetrating through the third substrate; and a fourth semiconductor chip stacked on the third semiconductor chip, the fourth semiconductor chip including a fourth substrate and a fourth front insulation layer on a front surface of the fourth substrate. The front surface or the backside surface of the second substrate is arranged to face the front surface of the first substrate. The front surface of the fourth substrate is arranged to face the front surface of the third substrate. A backside of the third substrate is arranged to face the backside surface of the second substrate such that the third substrate and the second backside insulation layer are bonded directly to each other, or the backside of the third substrate is arranged to face the front surface of the second substrate such that the third substrate and the second front insulation layer are bonded directly to each other.

According to some example embodiments, a semiconductor package includes a package substrate; first to fourth semiconductor chips sequentially stacked on the package substrate; and a molding member on the package substrate to cover the first to fourth semiconductor chips. A front surface or a backside surface of a second substrate of the second semiconductor chip is arranged to face a front surface of a first substrate of the first semiconductor chip. A front surface of a fourth substrate of the fourth semiconductor chip is arranged to face a front surface of a third substrate of the third semiconductor chip. A backside of the third substrate is arranged to face the backside surface of the second substrate such that the third substrate and a second backside insulation layer provided on the backside surface of the second substrate are bonded directly to each other, or the backside of the third substrate is arranged to face the front surface of the second substrate such that the third substrate and a second front insulation layer provided on the front surface of the second substrate are bonded directly to each other. A thickness of the third semiconductor chip is within a range of 5 μm to 20 μm, and a thickness of the second semiconductor chip is within a range of 10 μm to 30 μm. The thickness of the third semiconductor chip is smaller than the thickness of the second semiconductor chip.

According to some example embodiments, a semiconductor package may include first to fourth semiconductor chips sequentially stacked on one another. The front surface of the first semiconductor chip and a front surface of the second semiconductor chip may be bonded to face each other (face-to-face bonding), and a front surface of the third semiconductor chip and a front surface of the fourth semiconductor chip may be bonded to face each other (face-to-face bonding). Additionally, a third substrate of the third semiconductor chip and a second backside insulation layer of the second semiconductor chip may be bonded directly to each other, and a fourth bonding pad of the second semiconductor chip may be bonded directly to a third through electrode exposed from a backside surface of the third substrate.

Accordingly, it may be possible to provide a stacked structure of a semiconductor package having a thin and/or reduced thickness and which may improve a process yield of bonding a wafer and a die.

BRIEF DESCRIPTION OF THE DRAWINGS

Some examples of embodiments of the present inventive concepts will be more clearly understood from the following detailed description taken in conjunction with the accompanying drawings.

FIG. 1 is a cross-sectional view illustrating aspects of a semiconductor package in accordance with some example embodiments.

FIG. 2 is an enlarged cross-sectional view illustrating portion 'A' in FIG. 1.

FIG. 3 is an enlarged cross-sectional view illustrating portion 'B' in FIG. 1.

FIGS. 4 to 14 are cross-sectional views illustrating aspects of a method of manufacturing a semiconductor package in accordance with some example embodiments.

FIG. 15 is a cross-sectional view illustrating aspects of a semiconductor package in accordance with some example embodiments.

FIGS. 16 to 23 are cross-sectional views illustrating aspects of a method of manufacturing a semiconductor package in accordance with some example embodiments.

FIG. 24 is a cross-sectional view illustrating aspects of a semiconductor package in accordance with some example embodiments.

DETAILED DESCRIPTION

Hereinafter, some example embodiments will be explained in detail with reference to the accompanying drawings.

Figure 1:
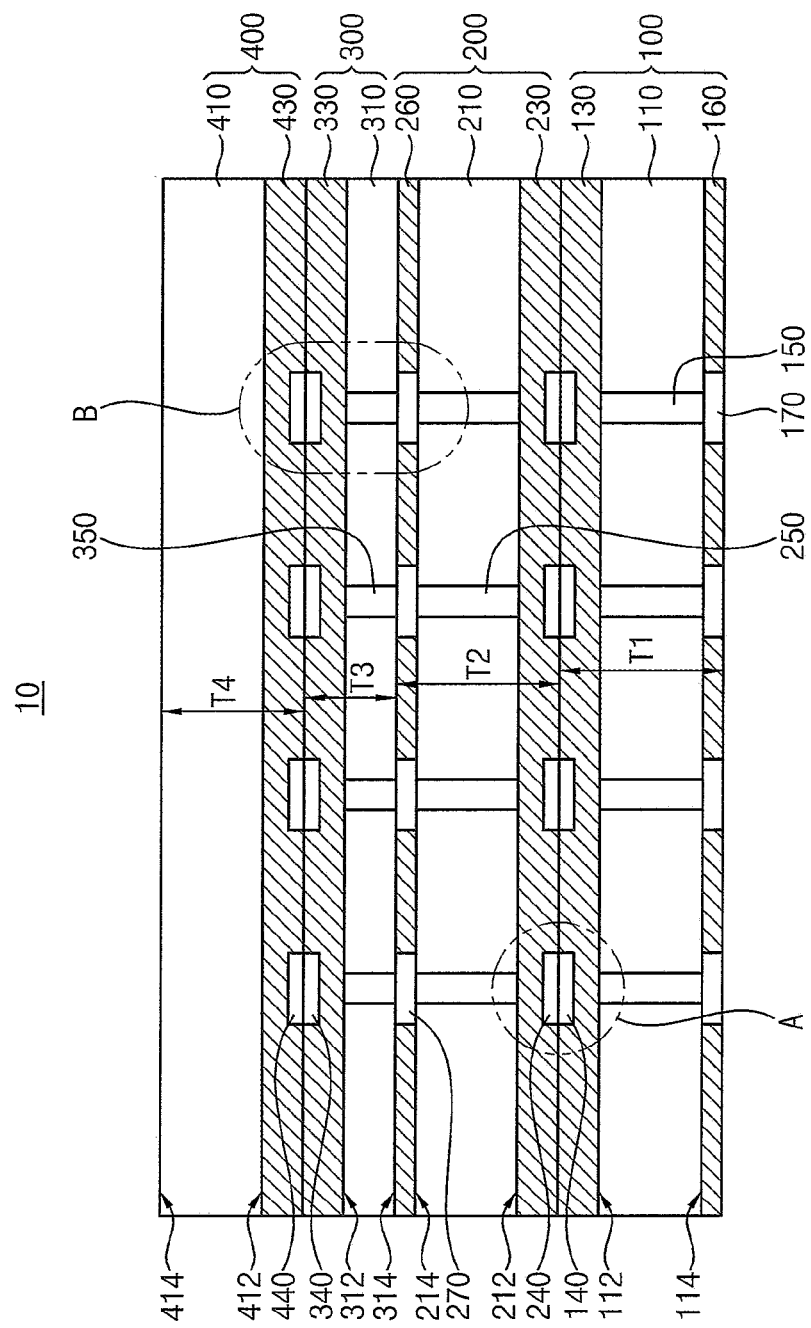
FIGS. 1 to 24 represent non-limiting, examples of embodiments as described herein.
Figure 2:
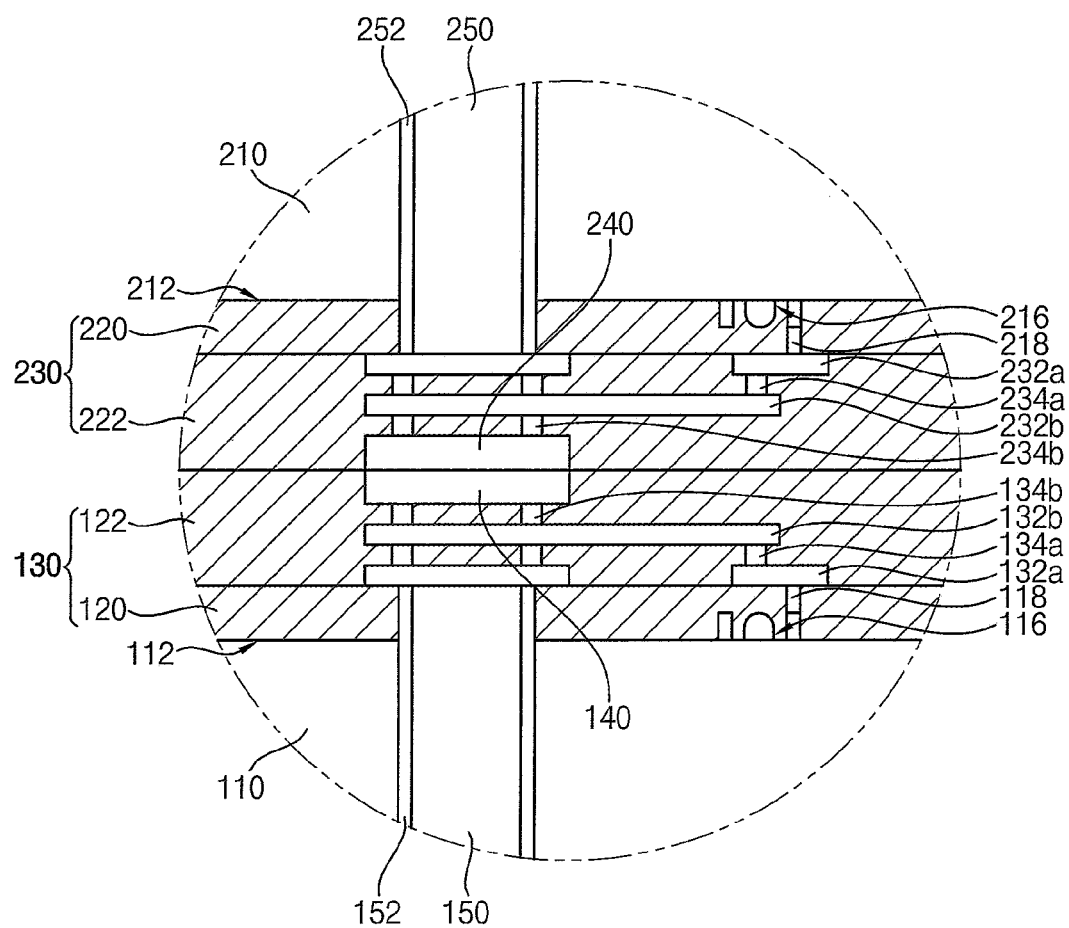
Figure 3:
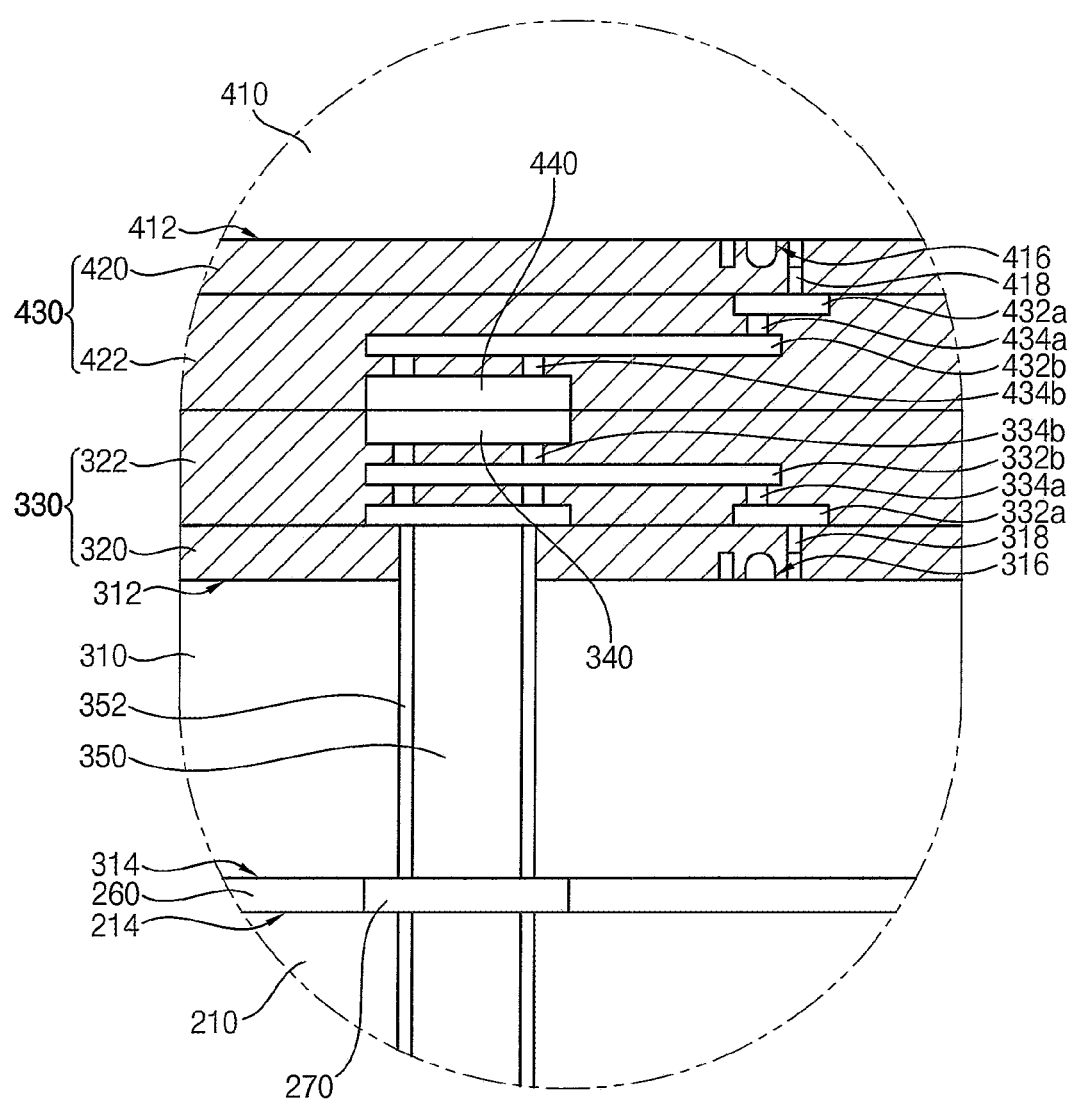

FIG. 1 is a cross-sectional view illustrating aspects of a semiconductor package in accordance with some example embodiments. FIG. 2 is an enlarged cross-sectional view illustrating portion 'A' in FIG. 1. FIG. 3 is an enlarged cross-sectional view illustrating portion 'B' in FIG. 1.

Referring to FIGS. 1 to 3, a semiconductor package 10 may include semiconductor chips stacked therein. The semiconductor package 10 may include first to fourth semiconductor chips 100, 200, 300, and 400, that are stacked on one another. In other words, the semiconductor package 10 may include sequentially stacked first to fourth semiconductor chips 100, 200, 300, and 400.

The first to fourth semiconductor chips 100, 200, 300, 400 may be stacked vertically. In some embodiments, the first to fourth semiconductor chips 100, 200, 300, 400 may be substantially the same or similar to each other. Thus, same or like reference numerals will be used to refer to the same or like elements and repeated descriptions of the same elements may be omitted.

The semiconductor package 10 may be a multi-chip package. Although the semiconductor package is illustrated as including four stacked semiconductor chips 100, 200, 300, 400, however, it may not limited thereto. For example, the semiconductor package may include 8, 12, or 16 stacked semiconductor chips.

Each of the first to fourth semiconductor chips 100, 200, 300, 400 may include an integrated circuit chip completed by performing semiconductor manufacturing processes. Each of the semiconductor chips may include, for example, a memory chip or a logic chip.

Hereinafter, firstly, the first semiconductor chip 100 will be explained in detail.

The first semiconductor chip 100 may include a first substrate 110, a first front insulation layer 130 having a first bonding pad 140 arranged on an outer surface thereof, and a first backside insulation layer 160 having a second bonding pad 170 arranged on an outer surface thereof. Additionally, the first semiconductor chip 100 may include a first through electrode 150 that penetrates through the first substrate 110.

The first substrate 110 may have a first surface 112 and a second surface 114 opposite to each other. The first surface 112 may be an active surface, and the second surface 114 may be a non-active surface. Circuit patterns 116 may be provided on the first surface 112 of the first substrate 110. The first surface 112 may be referred to as a front side surface on which the circuit patterns are formed, and the second surface 114 may be referred to as a backside surface.

The first substrate 110 may include, as examples, silicon, germanium, silicon-germanium, or III-V compounds, e.g., GaP, GaAs, GaSb, etc. In some embodiments, the first substrate 110 may be a silicon-on-insulator (SOI) substrate, or a germanium-on-insulator (GOI) substrate.

The circuit patterns 116 may include a transistor, a diode, or the like. The circuit patterns may constitute circuit elements. Accordingly, the first semiconductor chip 100 may be a semiconductor device including a plurality of the circuit elements formed therein.

The first front insulation layer 130, which may be an insulation interlayer, may be formed on the first surface 112. In other words, the first front insulation layer 30 may be formed on the front surface of the first substrate 110. The first front insulation layer 130 may include a plurality of insulation layers, and may include one or more wirings formed in the insulation layers. Additionally, the first bonding pad 140 may be provided in the outermost insulation layer of the first front insulation layer 130.

As an example of the first front insulation layer 130 including a plurality of insulation layers, and as seen in FIG. 2, the first front insulation layer 130 may include a first insulation interlayer 120 and a second insulation interlayer 122.

The first insulation interlayer 120 may be provided on the first surface 112 of the first substrate 110, and may cover the circuit patterns 116. The first insulation interlayer 120 may be formed to include, for example, silicon oxide or a low dielectric material. The first insulation interlayer 120 may include lower wirings 118 therein.

The second insulation interlayer 122 may include buffer layers and insulation layers stacked alternately on one another, although the buffer layers and insulation layers are not shown in detail in FIGS. 1-3. The buffer layers may include, as examples, silicon nitride, silicon carbon nitride (SiCN), silicon carbon oxynitride (SiCON), or the like. The insulation layers may include, as examples, silicon oxide, carbon doped silicon oxide, silicon oxynitride (SiCN), or the like.

The second insulation interlayer 122 may include a plurality of wirings therein. For example, the second insulation interlayer 122 may include a first metal line 132a, a first contact 134a, a second metal line 132b, and a second contact 134b. The first bonding pad 140 may be provided in the outermost insulation layer of the first front insulation layer 130. Stated differently, the first bonding pad may be on an opposite side of the first front insulation layer 130 from the first substrate 110. The first bonding pad 140 may be exposed through the outer surface of the first front insulation layer 130.

The circuit pattern 116 may be electrically connected to the first bonding pad 140 by the lower wirings 118 within the first insulation interlayer 120 and the wirings (e.g., first and second metal lines 132a and 132b, and first and second contacts 134a, 134b) within the second insulation interlayer 122.

The first through electrode 150 may penetrate through the first substrate 110 and the first insulation interlayer 120 and may make contact with the first metal line 132a. Accordingly, the first through electrode 150 may be electrically connected to the first bonding pad 140 by the wirings (e.g., first and second metal lines 132a and 132b, and first and second contacts 134a, 134b) within the second insulation interlayer 122.

A liner layer 152 may be provided on an outer surface (e.g., an outer sidewall) of the first through electrode 150. The liner layer may include silicon oxide or carbon doped silicon oxide. The liner layer 152 may insulate electrically the first substrate 110 and the first front insulation layer 130 from the first through electrode 150.

The first backside insulation layer 160 may be provided on the second surface 114, that is, the backside surface of the first substrate 110. The second bonding pad 170 may be provided in the first backside insulation layer 160. The first backside insulation layer 160 may include, as examples, silicon oxide, carbon doped silicon oxide, silicon carbon nitride (SiCN), or the like. Accordingly, the first and second bonding pads 140, 170 may be electrically connected to each other by the first through electrode 150.

The first and second bonding pads 140, 170 and the first through electrode 150 may include the same metal. For example, the metal may include copper (Cu). However, the present disclosure is not limited thereto, and the metal may include a material (e.g., gold (Au)) that can be bonded by inter-diffusion of metal by a high-temperature annealing process.

In some example embodiments, the second semiconductor chip 200 may include a second substrate 210, a second front insulation layer 230 provided on a front surface 212 of the second substrate 210, and a second backside insulation layer 260 provided on a backside surface 214 of the second substrate 210. The second semiconductor chip 200 may further include a second through electrode 250 penetrating through the second substrate 210. A third bonding pad 240 may be provided in the outermost insulation layer of the second front insulation layer 230. A fourth bonding pad 270 may be provided in the second backside insulation layer 260.

As illustrated in FIG. 2, the second semiconductor chip 200 may be arranged on the first semiconductor chip 100 such that the front surface 212 of the second substrate 210 faces the front surface 112 of the first substrate 110. The second front insulation layer 230 and the first front insulation layer 130 may be bonded directly to each other. Accordingly, the first bonding pad 140 and the third bonding pad 240 may be bonded to each other between the first semiconductor chip 100 and the second semiconductor chip 200 by Cu—Cu Hybrid Bonding.

The outermost insulation layers of the first and second front insulation layers 130, 230 may include the same insulating material to provide a bonding structure. The first and second front insulation layers 130, 230 may be bonded to each other by a high-temperature annealing process while in contact with each other. In some example embodiments, the bonding structure may have a stronger bonding strength by covalent bonding.

In some example embodiments, the third semiconductor chip 300 may include a third substrate 310, a third front insulation layer 330 provided on a front surface 312 of the third substrate 310, and a third through electrode 350 that penetrates through the third substrate 310. A fifth bonding pad 340 may be provided in the outermost insulation layer of the third front insulation layer 330.

The fourth semiconductor chip 400 may include a fourth substrate 410 and a fourth front insulation layer 430 provided on a front surface 412 of the fourth substrate 410. A seventh bonding pad 440 may be provided in the outermost insulation layer of the fourth front insulation layer 430.

As illustrated in FIG. 3, the third semiconductor chip 300 may be arranged on the second semiconductor chip 200 such that a backside surface 314 of the third substrate 310 faces the backside surface 214 of the second substrate 210. The backside surface 314 of the third substrate 310 and the second backside insulation layer 260 may be bonded directly to each other. The fourth bonding pad 270 may be bonded directly to the third through electrode 350 exposed from the backside surface 314 of the third substrate 310. Accordingly, the fourth bonding pad 270 and the third through electrode 350 may be bonded to each other between the second semiconductor chip 200 and the third semiconductor chip 300 by Cu—Cu Hybrid Bonding.

The fourth semiconductor chip 400 may be arranged on the second semiconductor chip such that the front surface 412 of the fourth substrate 410 faces the front surface 312 of the third substrate 310. The fourth front insulation layer 430 and the third front insulation layer 330 may be bonded directly to each other. Accordingly, the fifth bonding pad 340 and the seventh bonding pad 440 may be bonded to each other between the third semiconductor chip 300 and the fourth semiconductor chip 400 by Cu—Cu Hybrid Bonding.

In some example embodiments, a thickness T3 of the third semiconductor chip 300 may be smaller than a thickness T1 of the first semiconductor chip 100. In some example embodiments, the thickness T3 of the third semiconductor chip 300 may be less than or equal to a thickness T2 of the second semiconductor chip 200. The thickness T1 of the first semiconductor chip 100 may be smaller than a thickness T4 of the fourth semiconductor chip 400. A thickness of the third substrate 310 may be smaller than thicknesses of the first, second and fourth substrates 110, 210, 410.

For example, the thickness T3 of the third semiconductor chip 300 may be within a range of 5 μm to 20 μm, and the thickness T2 of the second semiconductor chip 200 may be within a range of 10 μm to 30 μm.

As discussed herein, when the front surface of the first semiconductor chip 100 and the front surface of the second semiconductor chip 200 are bonded to face each other (face-to-face bonding), the front surface of the third semiconductor chip 300 and the front surface of the fourth semiconductor chip 400 may be bonded to face each other (face-to-face bonding). Additionally, the third substrate 310 of the third semiconductor chip 300 and the second backside insulation layer 260 of the second semiconductor chip 200 may be bonded directly to each other, and the fourth bonding pad 270 of the second semiconductor chip 200 may be bonded directly to the third through electrode 350 exposed from the backside surface 314 of the third substrate 310.

Accordingly, it may be possible to provide a stacked structure of the semiconductor package having a thin and/or reduced thickness and that may improve a process yield of bonding a wafer and a die.

Hereinafter, aspects of a method of manufacturing the semiconductor package in FIG. 1 will be explained.

Figure 4:
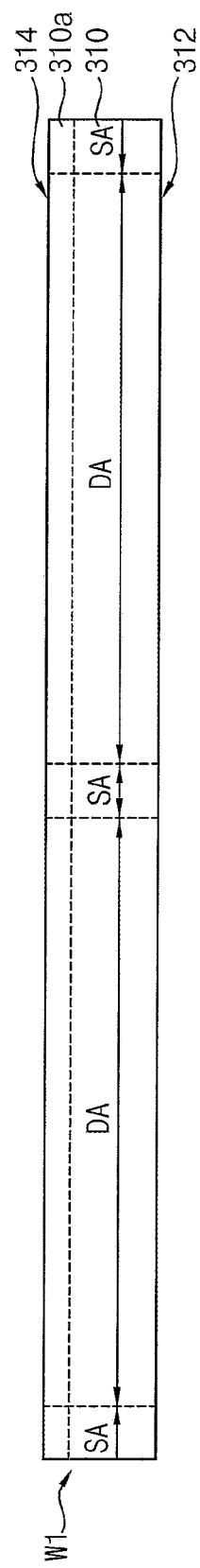
Figure 5:
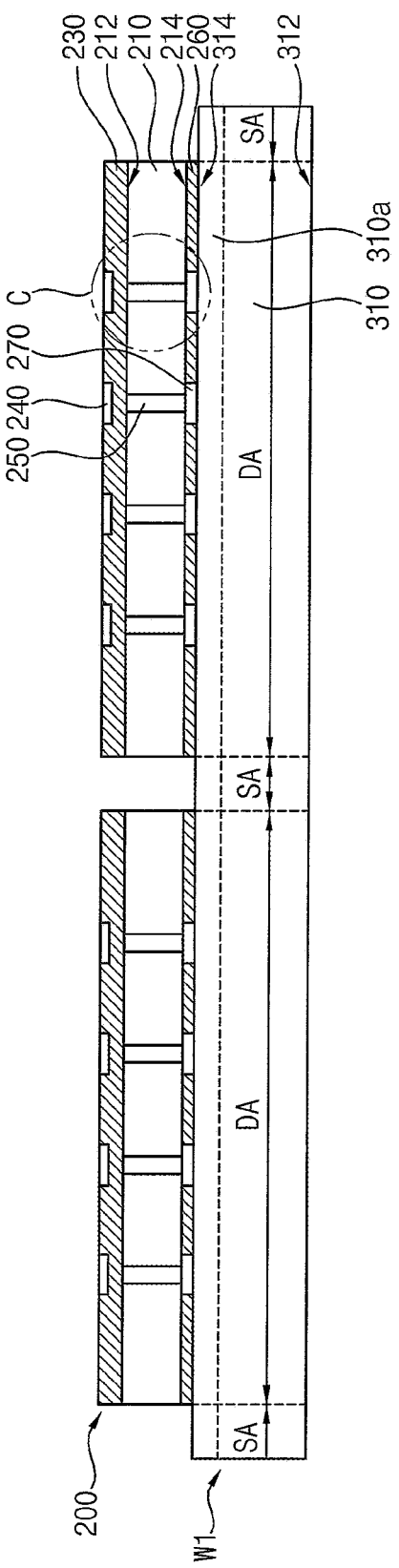
Figure 6:
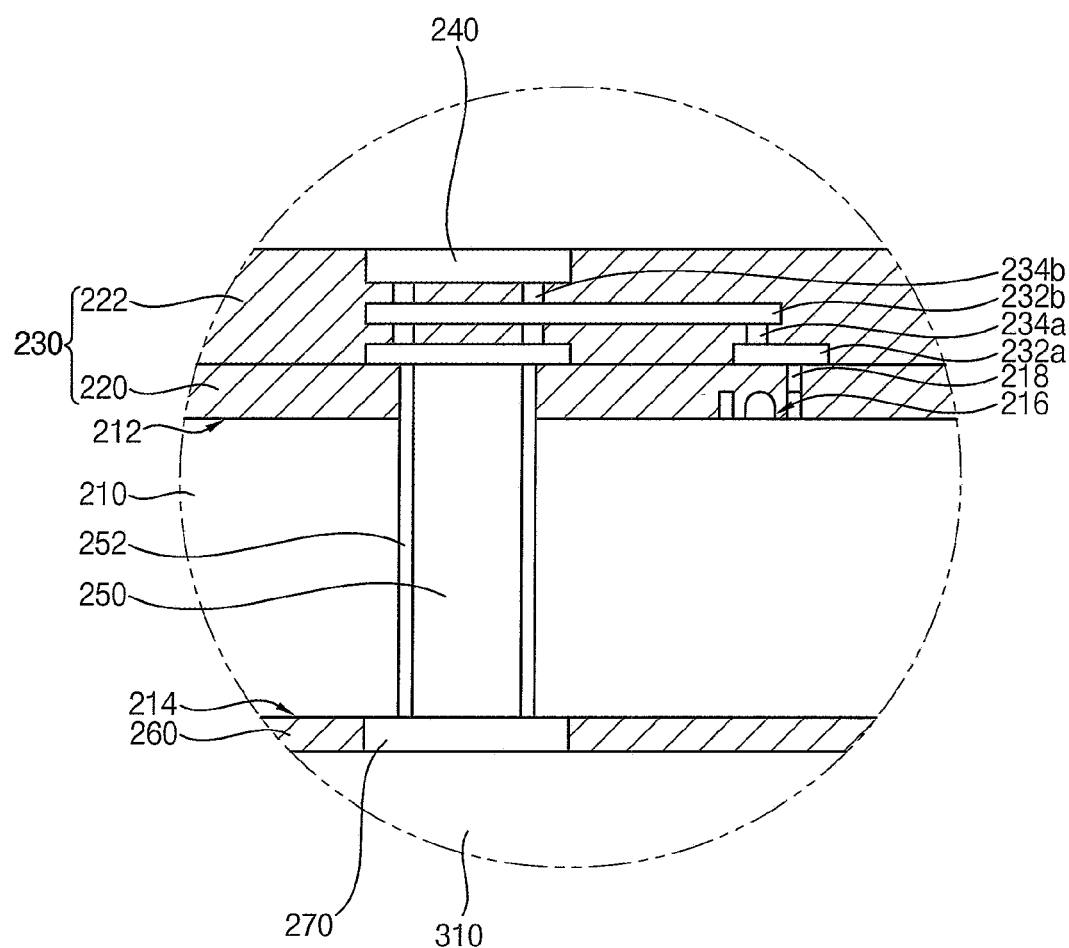
Figure 7:
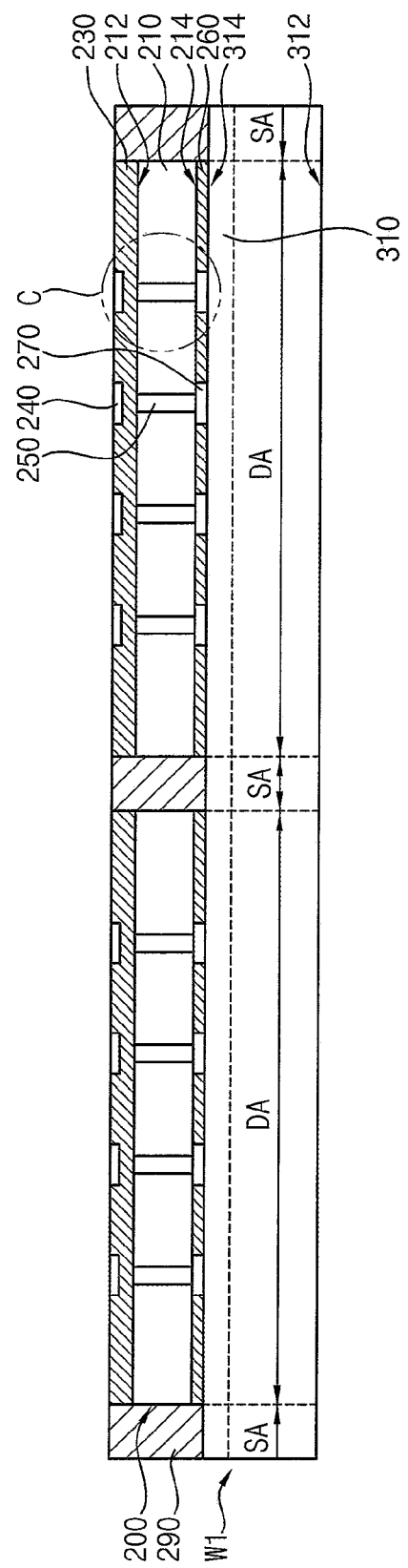
Figure 8:
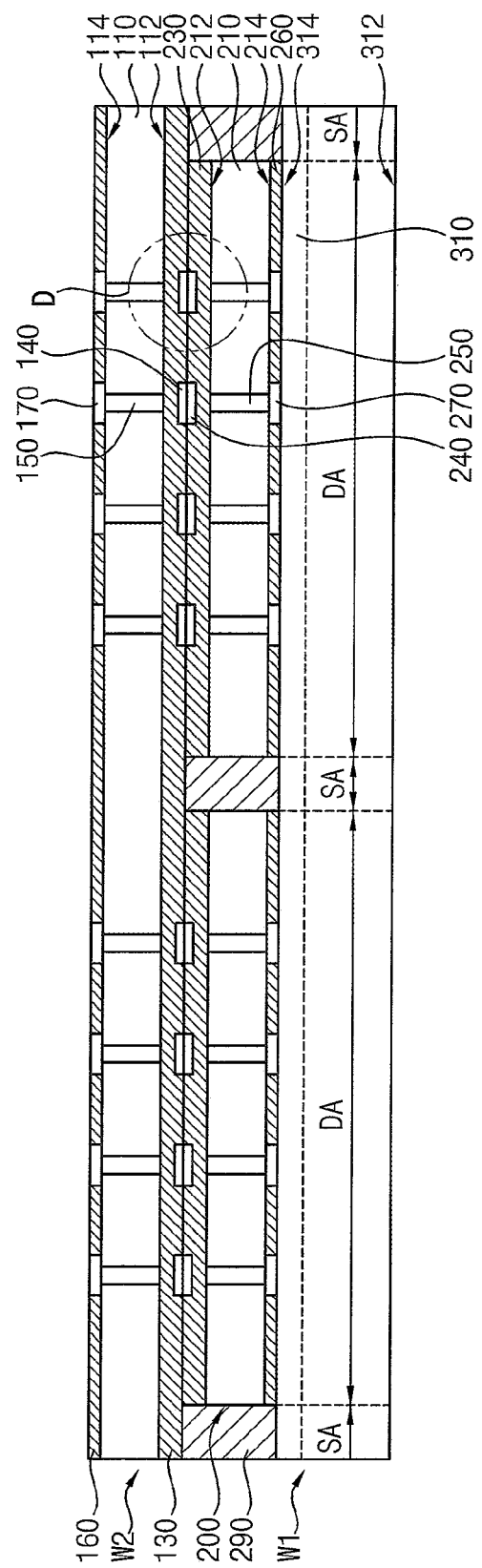
Figure 9:
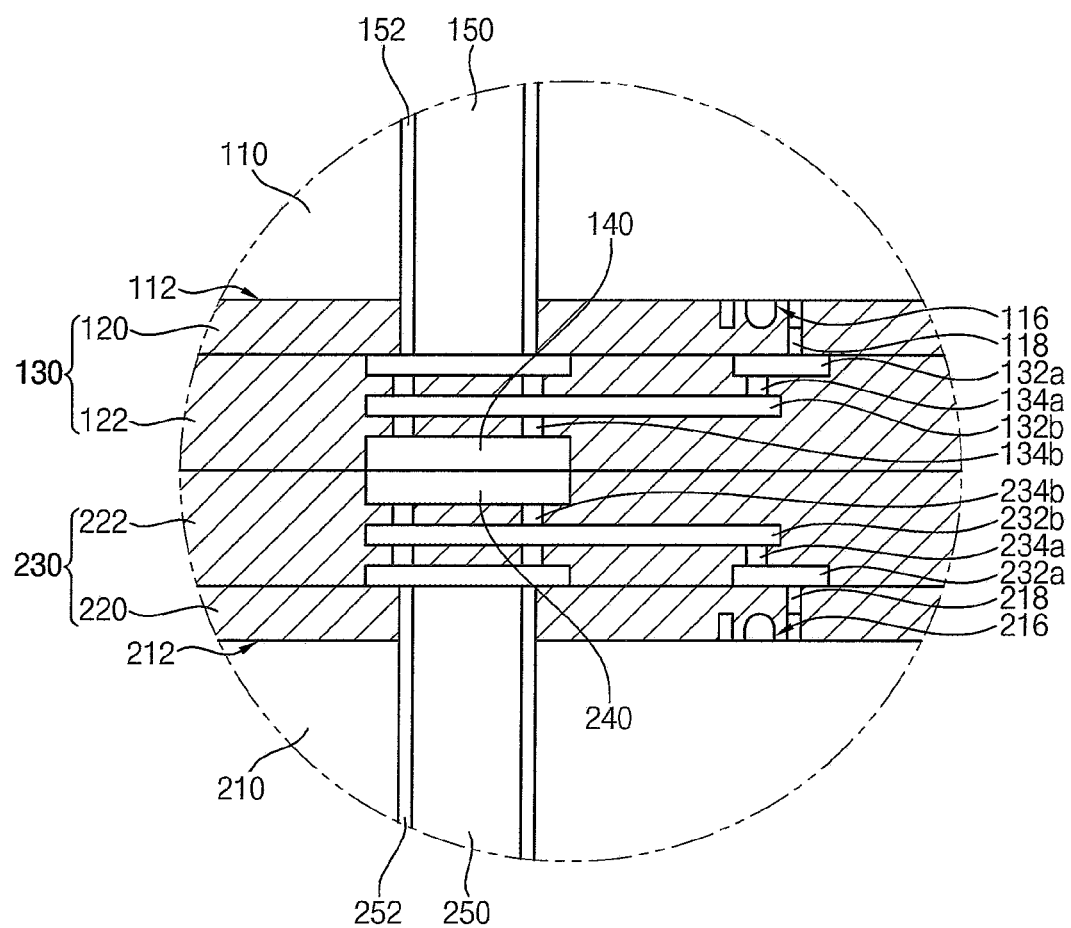
Figure 10:
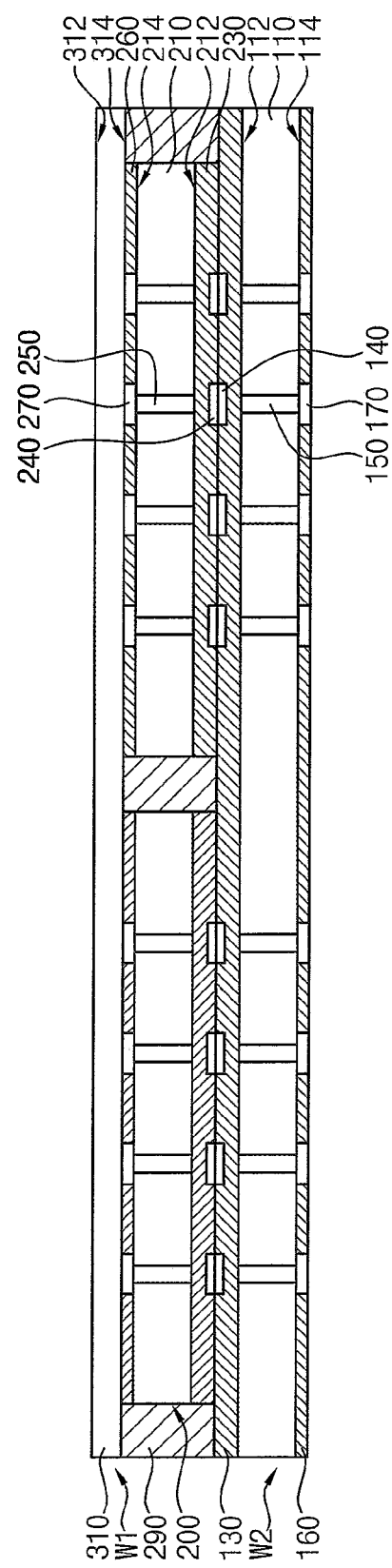
Figure 11:
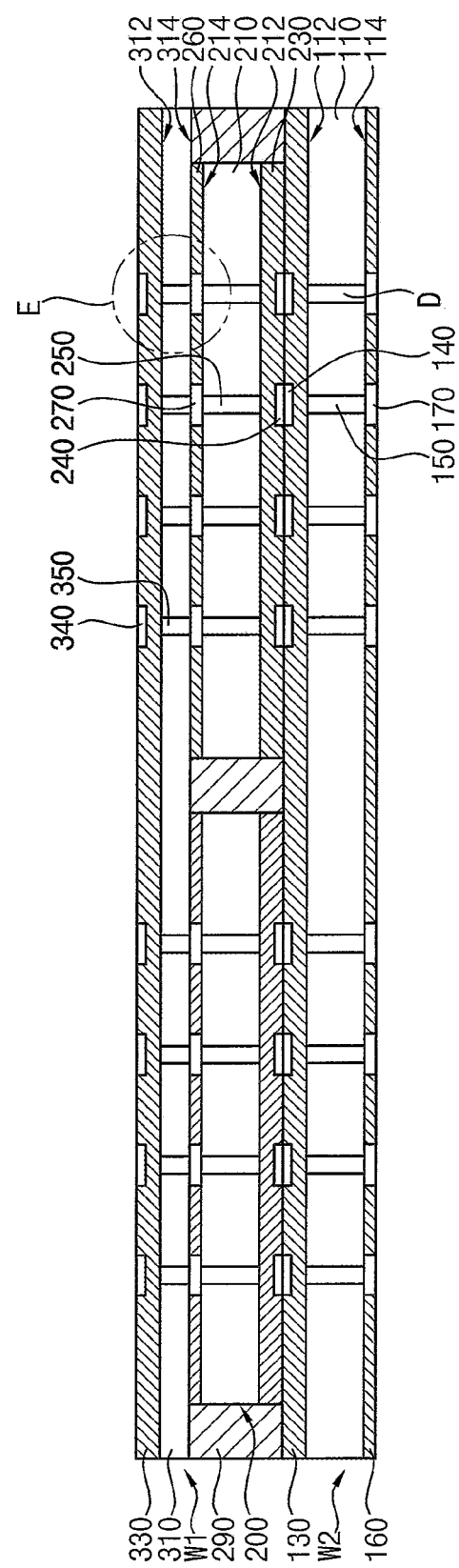
Figure 12:
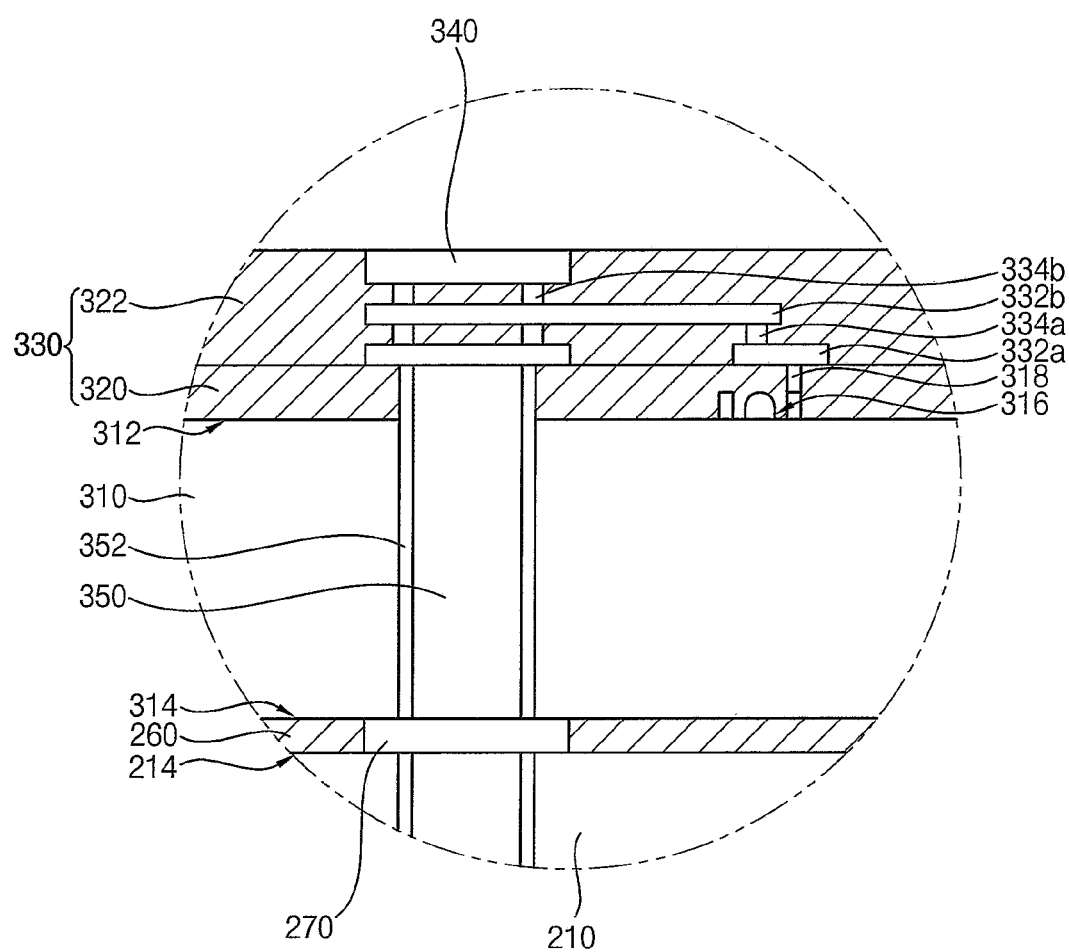
Figure 13:
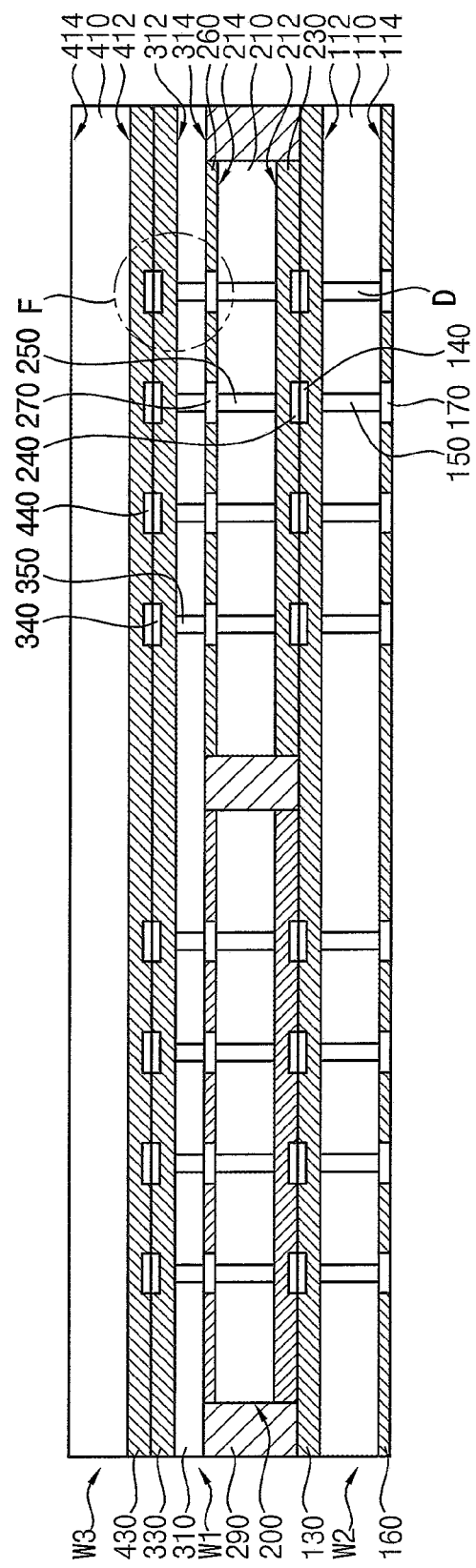
Figure 14:
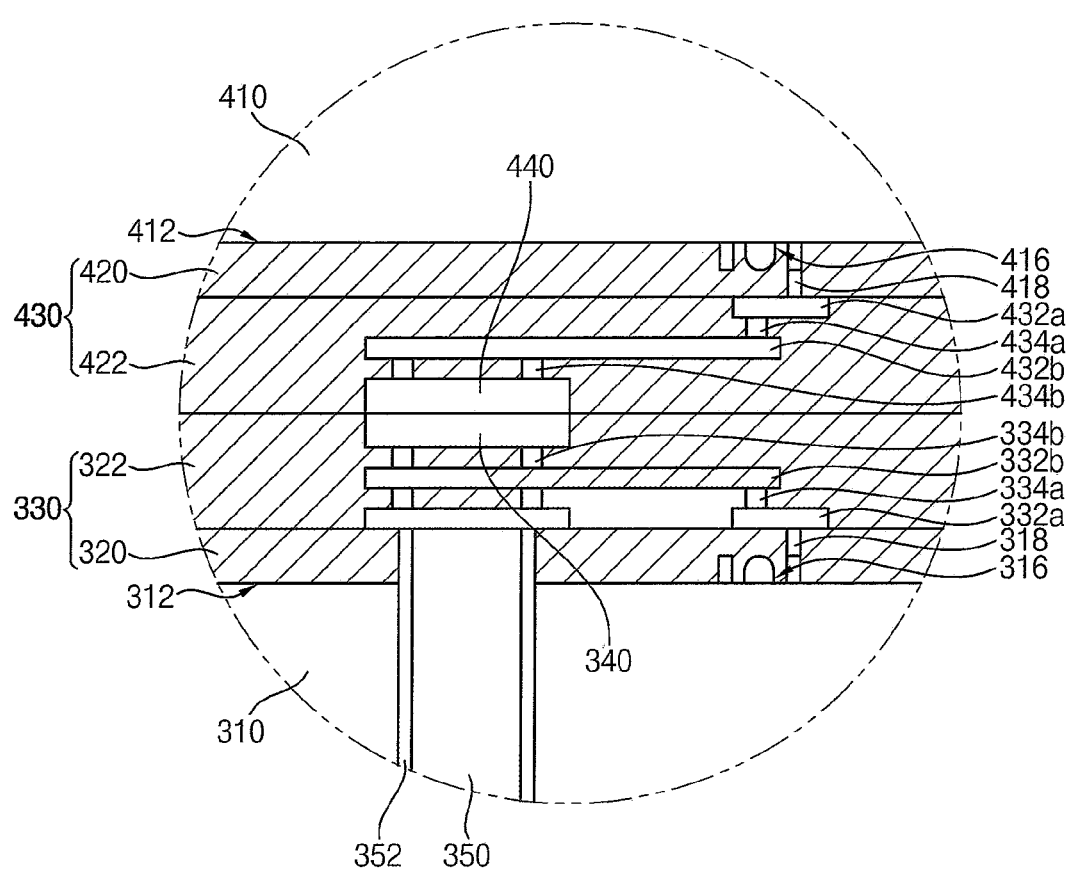

FIGS. 4 to 14 are cross-sectional views illustrating aspects of a method of manufacturing a semiconductor package in accordance with some example embodiments. FIG. 6 is an enlarged cross-sectional view illustrating portion 'C' in FIG. 5. FIG. 9 is an enlarged cross-sectional view illustrating portion 'D' in FIG. 8. FIG. 12 is an enlarged cross-sectional view illustrating portion 'E' in FIG. 11. FIG. 14 is an enlarged cross-sectional view illustrating portion 'F' in FIG. 13.

Referring to FIGS. 4 to 6, a plurality of second semiconductor chips 200 may be arranged on a first wafer W1.

In some example embodiments, the first wafer W1 may include a third substrate 310. The third substrate 310 may have a first surface 312 and a second surface 314 opposite to each other. The third substrate 310 may include a die region DA where circuit patterns and cells are formed, and the third substrate 310 may include a scribe lane region SA that surrounds the die region DA. The third substrate 310 may be sawed along the scribe lane region SA dividing the die regions DA by a following singulation process to form individual semiconductor chips.

The first wafer W1 may be a silicon layer transition (SiLT) wafer having a relatively low activation energy. The third substrate 310 may include a doped region 310a having a predetermined depth into the third substrate 310 from the second surface 314. The doped region 310a may provide a region in which circuit patterns are formed later.

As an example, an ion implantation process may be performed on the second surface 314 of the third substrate 310 to form the doped region 310a. Ions (e.g., hydrogen ions) may be doped at a low concentration to a predetermined depth into the third substrate 310 from the second surface 314 of the third substrate 310 by the ion implantation process. A thickness of the doped region 310a may be within a range of 5 μm to 20 μm.

As described later, and as an example, the first surface 312 of the third substrate 310 may be polished by a polishing process to expose a surface of the doped region 310a, and circuit patterns may be formed in the exposed surface of the doped region 310a. The circuit patterns may be formed by performing a front end of line (FEOL) process for manufacturing a semiconductor device on the surface of the SiLT wafer, that is, on the surface of the doped region 310a. The surface of the third substrate 310 on which the FEOL process is performed may be referred to as a front side surface of the third substrate 310, and a surface opposite to the front surface may be referred to as a backside surface.

As illustrated in FIGS. 5 and 6, after arranging the first wafer W1 to be supported on a carrier substrate (not illustrated), the second semiconductor chips 200 may be arranged on the first wafer W1 corresponding to the die regions DA. The second semiconductor chip 200 may be stacked on the first wafer W1 such that a second surface 214 of the second semiconductor chip 200 faces the first wafer W1.

The second semiconductor chips 200 may be attached on the second surface 314 of the first wafer W1 by performing a thermal compression process at a predetermined temperature (e.g., about 400° C. or less). As a result of the thermal compression process, the second semiconductor chip 200 and the first wafer W1 may be bonded to each other by hybrid bonding. That is, a second backside insulation layer 260 on a backside surface of the second semiconductor chip 200 may be directly bonded to the third substrate 310 of the first wafer W1. In other words, the second surface 214 of a second substrate 210 may be directly bonded to the third substrate 310 of the first wafer W1.

Referring to FIG. 7, a filling support layer 290 may be formed to fill spaces between the second semiconductor chips 200.

In some example embodiments, the filling support layer 290 may be formed on the first wafer W1, and may fill the spaces between the second semiconductor chips 200. An upper surface of the filling support layer 290 may be coplanar with an upper surface of the second semiconductor chip 200. The filling support layer 290 may be formed by a dispensing process or a spin coating process. For example, the filling support layer 290 may include a thermosetting resin or the like.

In some example embodiments, for example where the second semiconductor chips 200 can be supported (e.g., firmly supported) by the hybrid bonding, forming the filling support layer may be omitted. Accordingly, in some example embodiments forming the filling support layer may be optional.

Referring to FIGS. 8 and 9, a second wafer W2 may be stacked on the second semiconductor chips 200 on the first wafer W1.

In some example embodiments, the second wafer W2 may be stacked on the second semiconductor chips 200 such that a first surface 112 of a first substrate 110 of the second wafer W2 faces the first surface 212 of the second substrate 210. Stated differently, a front surface of the first substrate 110 of the second wafer W2 faces the front surface of the second semiconductor chip 200. A first bonding pad 140 of the second wafer W2 and a third bonding pad 240 of the second semiconductor chip 200 may contact each other. The front surface of the second semiconductor chip 200 and the front surface of the second wafer W2 may be boned to each other (face-to-face bonding). When the second wafer W2 and the second semiconductor chip 200 are bonded to each other by wafer-to-die bonding, the first bonding pad 140 of the second wafer W2 and the third bonding pad 240 of the second semiconductor chip 200 may be bonded to each other by Cu—Cu Hybrid Bonding.

Referring to FIG. 10, the structure of FIG. 8 may be turned over, the first surface 312 of the first wafer W1 (which may now be an upper surface) may be polished. Subsequent to the polishing of the first surface 312, circuit patterns may be formed on the polished first surface 312.

A semiconductor device manufacturing process may be performed on the first surface 312 of the third substrate 310 exposed by the polishing process, that is, on the SiLT wafer surface, to form the circuit patterns. Accordingly, the first surface 312 of the third substrate 310 on which the circuit patterns are formed may be referred to as a front surface, and the second surface 314 of the third substrate 310 may be referred to as a rear surface.

Referring to FIGS. 11 and 12, a third through electrode 350 may be formed in the third substrate 310 of the first wafer W1, and a third front insulation layer 330 having a fifth bonding pad 340 may be formed on the first surface 312 of the third substrate 310.

In some example embodiments, a first insulation interlayer 320 may be formed on the first surface 312 of the third substrate 310. The first insulation interlayer 320 may cover the circuit patterns 316. Lower wirings 318 including contacts may be formed in the first insulation interlayer 320.

Some of upper surfaces of the lower wirings 318 may be exposed from a surface of the first insulation interlayer 320.

An opening may be formed to penetrate though the first insulation interlayer 320 and the third substrate 310 in a thickness direction.

After forming a photoresist pattern on the first insulation interlayer 320 on the third substrate 310 to expose the opening region, portions of the first insulation interlayer 320 and the third substrate 310 may be etched using the photoresist pattern as an etching mask to form the opening. The etch process may be performed until a fourth bonding pad 270 of the second semiconductor chip 200 is exposed. Accordingly, the opening may expose a surface of the fourth bonding pad 270 of the second semiconductor chip 200. Subsequent to the etching process, the photoresist pattern may be removed from the third substrate 310.

A liner insulation layer may be formed along a profile of sidewalls and a bottom face of the opening and the upper surface of the first insulation interlayer 320. The liner insulation layer may insulate the third substrate 310 from a conductive material in the opening. The liner insulation layer may be formed of silicon oxide or carbon doped silicon oxide. Then, an etch process may be performed on the liner insulation layer to form a liner layer 352. The etch process may be performed until the fourth bonding pad 270 of the second semiconductor chip 200 is exposed. Accordingly, the surface of the fourth bonding pad 270 of the second semiconductor chip 200 may be exposed by the liner layer 352.

The third through electrode 350 may then be formed in the opening to make contact with the fourth bonding pad 270 of the second semiconductor chip 200.

For example, after forming a barrier metal layer on the liner layer 352, a seed layer may be formed on the barrier metal layer. Then, a conductive layer may be formed on the seed layer to fill the opening.

The barrier metal layer may be formed to include a metal nitride, e.g., titanium nitride, tantalum nitride, or the like, and/or a metal, e.g., titanium, tantalum, or the like. A physical vapor deposition process may be performed to deposit a copper layer as the seed layer. The conductive layer may include a metal such as copper.

Then, a chemical mechanical polish process may be performed on the conductive layer, the barrier metal layer, and the liner layer to form the third through electrode 350 as a through silicon via.

Then, a second insulation interlayer 322 may be formed on the first insulation interlayer 320. Thus, a third front insulation layer 330 including the first insulation interlayer 320 and the second insulation interlayer 322 may be formed on the first surface 312, that is, the front surface of the third substrate 310.

The second insulation interlayer 322 may include buffer layers and insulation layers stacked alternately on one another. For example, the buffer layers may include silicon nitride, silicon carbon nitride (SiCN), silicon carbon oxynitride (SiCON), as examples. The insulation layers may include silicon oxide, carbon doped silicon oxide, silicon oxynitride (SiCN), etc.

The second insulation interlayer 322 may include a plurality of wirings therein. For example, the second insulation interlayer 322 may include a first metal line 332a, a first contact 334a, a second metal line 332b, and a second contact 334b. The fifth bonding pad 340 may be provided in the outermost insulation layer of the third front insulation layer 330. The fifth bonding pad 340 may be exposed through an outer surface of the third front insulation layer 330.

The circuit pattern 316 may be electrically connected to the fifth bonding pad 340 by the lower wirings 318 and the wirings (e.g., the first metal line 332a, the first contact 334a, the second metal line 332b, and the second contact 334b). The third through electrode 350 may be electrically connected to the fifth bonding pad 340 by the wirings. Additionally, the third through electrode 350 formed in the first wafer W1 may contact the fourth bonding pad 270 of the second semiconductor chip 200.

Referring to FIGS. 13 and 14, a third wafer W3 may be stacked on the third front insulation layer 330 on the first wafer W1.

In some example embodiments, the third wafer W3 may be stacked such that a first surface 412 of the fourth substrate 410 of the third wafer W3 faces the first surface 312 of the third substrate 310 of the first wafer W1. In other words, the front surface of the fourth substrate 410 of the third wafer W3 faces the front surface of the third substrate 310 of the first wafer W1. A seventh bonding pad 440 of the third wafer W3 and the fifth bonding pad 340 of the first wafer W1 may contact each other. The first wafer W1 and the third wafer W3 may be bonded to each other such that the front surface of the first wafer W1 and the front surface of the third wafer W3 face each other (face-to-face bonding). When the third wafer W3 and the first wafer W1 are bonded to each other by wafer-to-wafer bonding, the seventh bonding pad 440 of the third wafer W3 and the fifth bonding pad 340 of the first wafer W1 may be bonded to each other by Cu—Cu Hybrid Bonding.

Then, the first to third wafers W1, W2, and W3 and the filling support layer 290 may be cut along the scribe lane region SA by a sawing process to form individualized semiconductor packages.

Figure 15:
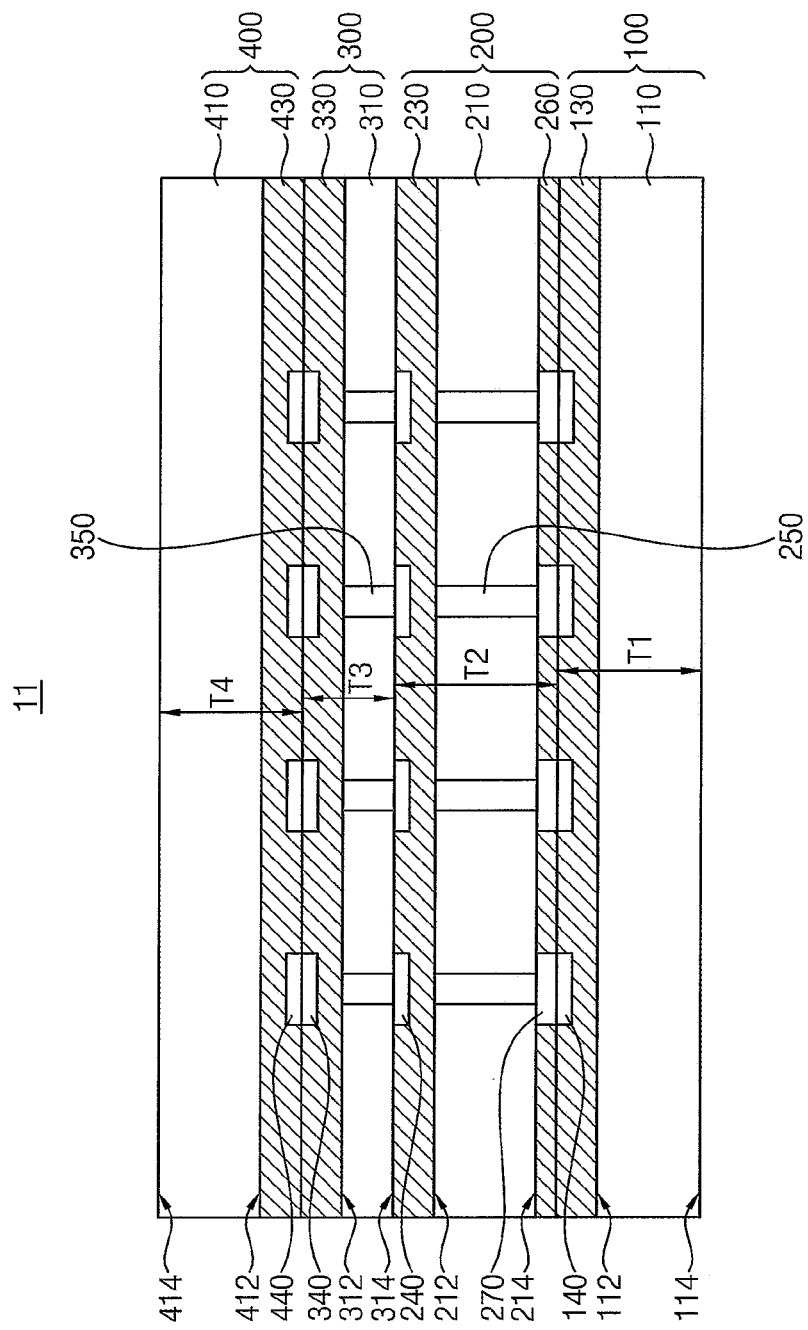

FIG. 15 is a cross-sectional view illustrating aspects of a semiconductor package in accordance with some example embodiments. Aspects of the semiconductor package of FIG. 15 may be substantially the same as or similar to aspects of the semiconductor package described with reference to FIGS. 1 to 3, except for a junction structure of a first semiconductor chip and a second semiconductor chip. Thus, same reference numerals will be used to refer to the same or like elements and any further repetitive explanation concerning the above elements will be omitted for brevity.

Referring to FIG. 15, a second semiconductor chip 200 may be arranged on a first semiconductor chip 100 such that a backside surface 214 of a second substrate 210 of the second semiconductor chip 200 faces a front surface 112 of a first substrate 110 of the first semiconductor chip 100. A second backside insulation layer 260 and a first front insulation layer 130 may be bonded directly to each other.

Accordingly, a first bonding pad 140 and a fourth bonding pad 270 may be bonded to each other between the first semiconductor chip 100 and the second semiconductor chip 200 by Cu—Cu Hybrid Bonding.

In some example embodiments, a third semiconductor chip 300 may be arranged on the second semiconductor chip 200 such that a backside surface 314 of a third substrate 310 of the third semiconductor chip 300 faces a front surface 212 of the second substrate 210. The backside surface 314 of the third substrate 310 and a second front insulation layer 230 may be bonded directly to each other. A third bonding pad 240 of the second semiconductor chip 200 may be bonded directly to a third through electrode 350 exposed from the backside surface 314 of the third substrate 310.

Accordingly, the third bonding pad 240 and the third through electrode 350 may be bonded to each other between the second semiconductor chip 200 and the third semiconductor chip 300 by Cu—Cu Hybrid Bonding.

Hereinafter, aspects a method of manufacturing the semiconductor package illustrated in FIG. 15 will be described.

FIGS. 16 to 23 are cross-sectional views illustrating aspects of a method of manufacturing a semiconductor package in accordance with some example embodiments.

Figure 16:
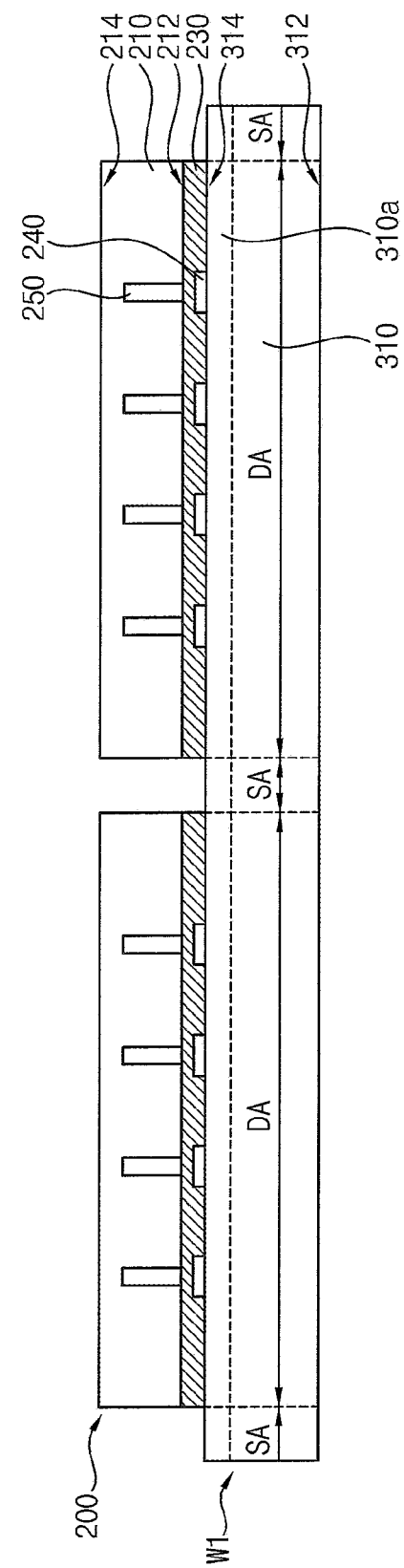

Referring to FIG. 16, a plurality of second semiconductor chips 200 may be arranged on a first wafer W1.

In some example embodiments, the first wafer W1 may be a silicon layer transition (SiLT) wafer having a relatively low activation energy. A third substrate 310 may include a doped region 310a having a predetermined depth into the third substrate 310 from a second surface 314. The doped region 310a may provide a region in which circuit patterns are formed later The second semiconductor chip 200 may be stacked on the first wafer W1 such that a first surface 212 of a second substrate 210 of the second semiconductor chip 200 faces the first wafer W1. At this time, since a second surface 214 of the second substrate 210 is in a state before being ground (e.g., a pre-ground state), the second semiconductor chip 200 may have a relatively large thickness. Accordingly, it can be handled smoothly in following alignment and thermal compression processes.

The second semiconductor chips 200 may be attached on the second surface 314 of the first wafer W1 by performing a thermal compression process at a predetermined temperature (e.g., about 400° C. or less). As a result of the thermal compression process, the second semiconductor chip 200 and the first wafer W1 may be bonded to each other by hybrid bonding. That is, a second front insulation layer 230 on a front surface of the second semiconductor chip 200 may be directly bonded to the third substrate 310 of the first wafer W1. In other words, a second front insulation layer 230 on the first surface 212 of the second substrate 210 may be directly bonded to the third substrate 310 of the first wafer W1.

Figure 17:
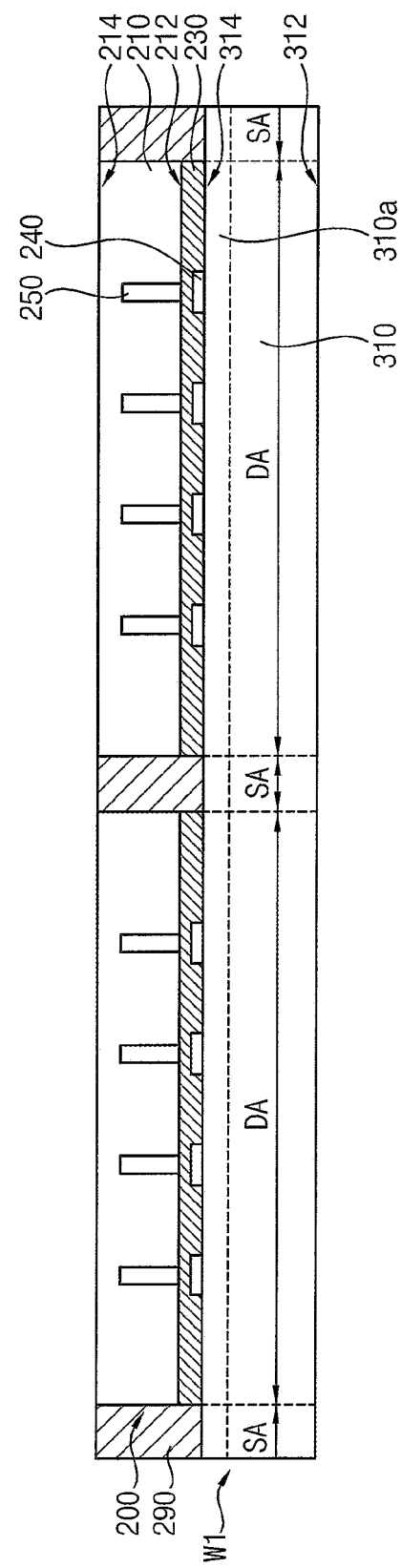
Figure 18:
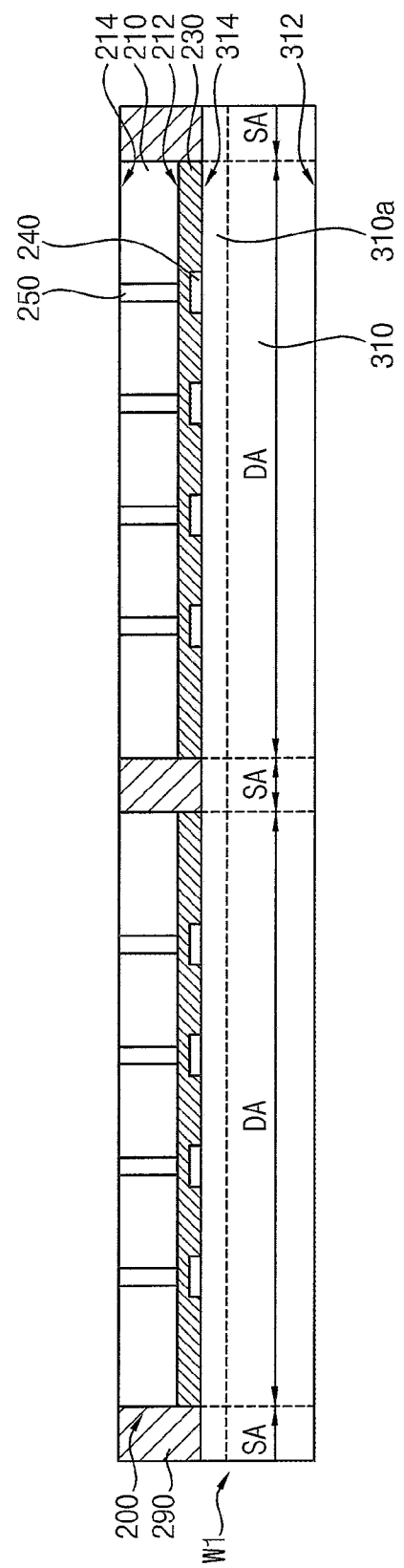

Referring to FIGS. 17 and 18, processes that are the same as or similar to the processes described with reference to FIG. 7 may be performed to form a filling support layer 290, which may fill spaces between the second semiconductor chips 200, and then, the second surfaces 214 of the second semiconductor chips 200 may be ground.

A second through electrode 250 may be exposed by partially removing the second surface 214 of the second semiconductor chip 200. For example, a grinding process such as a chemical mechanical polishing process may be performed to partially remove the second surface 214 of the second semiconductor chip 200. In this case, an upper surface of the filling support layer 290 may also be partially removed.

Since the process of adjusting a thickness of the second semiconductor chip 200 may be performed in a state in which the second semiconductor chip 200 is hybrid bonded to the first wafer W1, grinding processes to be performed individually on the second semiconductor chips before the step of bonding the second semiconductor chips 200 can be omitted.

Figure 19:
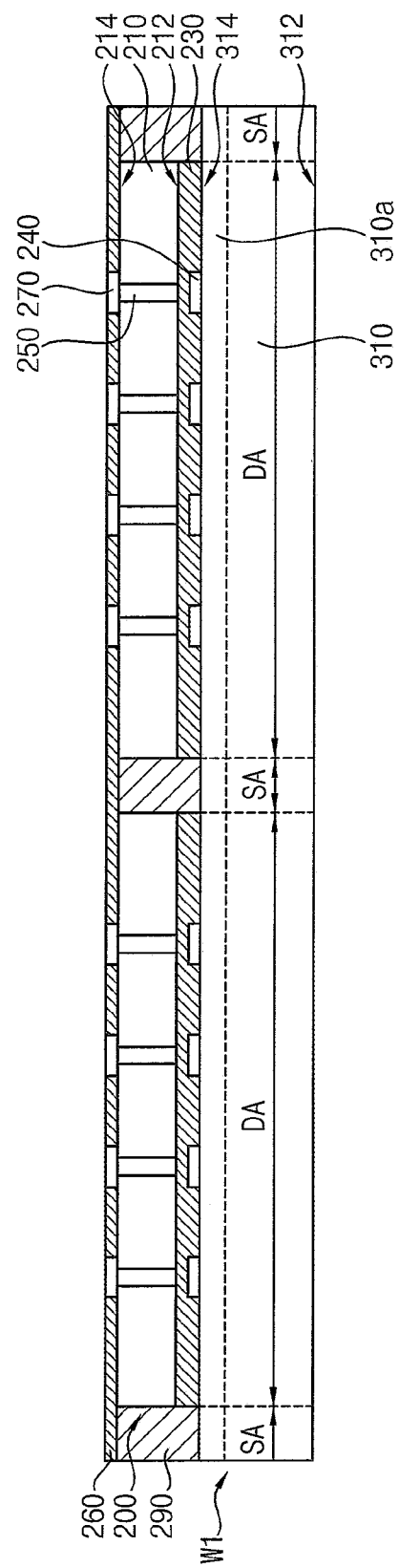

Referring to FIG. 19, a second backside insulation layer 260 having a fourth bonding pad 270 may be formed on the second surface 214 of the second substrate 210 of the second semiconductor chips 200.

In some example embodiments, an insulation layer may be formed on the second surface 214 of the second substrate 210, the insulation layer may be patterned to form an opening exposing an end portion of the second through electrode 250, and then, a plating process may be performed to form the fourth bonding pad 270. The insulation layer may include silicon oxide, carbon doped silicon oxide, silicon carbon nitride (SiCN), or the like.

Figure 20:
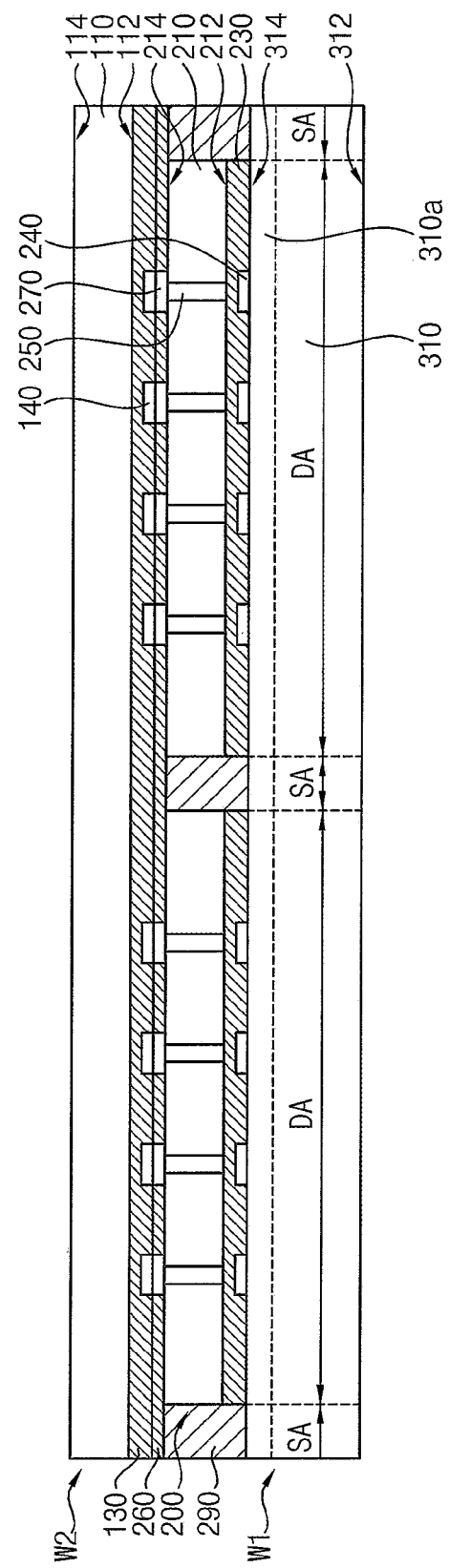

Referring to FIG. 20, processes that are the same as or similar to the processes described with reference to FIGS. 8 and 9 may be performed to stack a second wafer W2 on the second semiconductor chips 200 on the first wafer W1.

In some example embodiments, the second wafer W2 may be stacked on the second semiconductor chips 200 such that a first surface 112, that is, a front surface of a first substrate 110 of the second wafer W2 faces a backside surface of the second semiconductor chip 200, that is, the second surface 214 of the second substrate 210. A first bonding pad 140 of the second wafer W2 and the fourth bonding pad 270 of the second semiconductor chip 200 may contact each other. The backside surface of the second semiconductor chip 200 and the front surface of the second wafer W2 may be bonded to each other. When the second wafer W2 and the second semiconductor chip 200 are bonded to each other by wafer-to-die bonding, the first bonding pad 140 of the second wafer W2 and the fourth bonding pad 270 of the second semiconductor chip 200 may be bonded to each other by Cu—Cu Hybrid Bonding.

Figure 21:
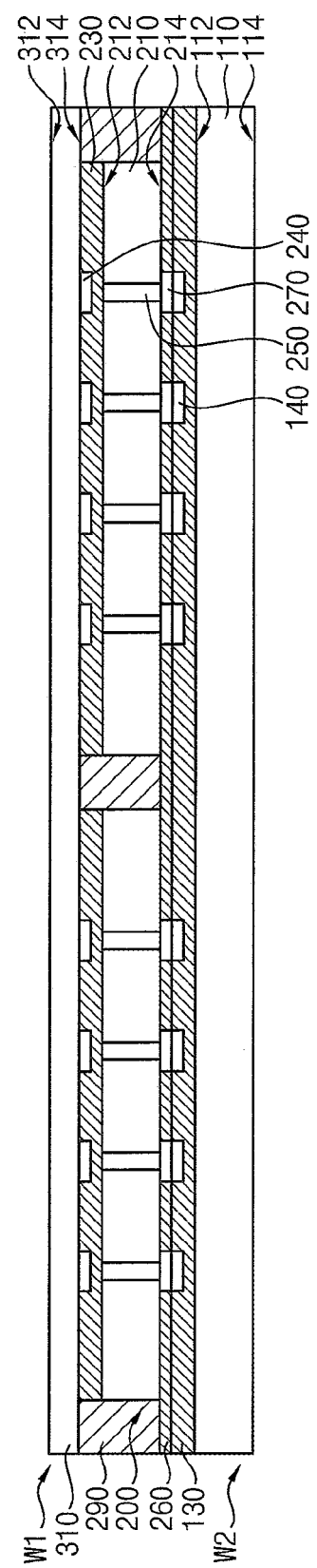
Figure 22:
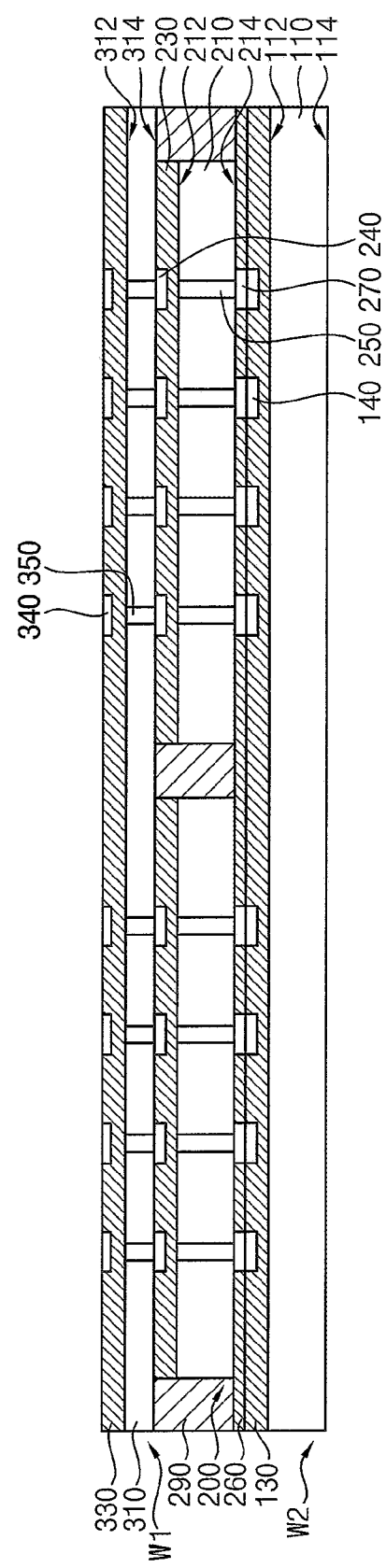

Referring to FIGS. 21 and 22, processes that are the same as or similar to the processes described with reference to FIGS. 10 to 12 may be performed to polish the first surface 312 of the first wafer W1 and to form circuit patterns on the polished first surface 312, and then, a third through electrode 350 may be formed in the third substrate 310 of the first wafer W1 and a third front insulation layer 330 having a fifth bonding pad 340 may be formed on the first surface 312 of the third substrate 310.

In some example embodiments, the structure of FIG. 20 may be turned over, the first surface 312 of the first wafer W1 may be polished, and then, the circuit patterns may be formed on the polished first surface 312. A semiconductor device manufacturing process may be performed on the first surface 312 of the third substrate 310 exposed by the polishing process, that is, on the SiLT wafer surface, to form the circuit patterns.

Then, a first insulation interlayer may be formed on the first surface 312 of the third substrate 310 to cover the circuit patterns, and then, an opening may be formed to penetrate though the first insulation interlayer and the third substrate in a thickness direction. The opening may expose a surface of a third bonding pad 240 of the second semiconductor chip 200.

Then, a liner insulation layer may be formed along a profile of sidewalls and a bottom face of the opening and an upper surface of the first insulation interlayer. The liner insulation layer may insulate the third substrate 310 from a conductive material in the opening. The liner insulation layer may be formed of silicon oxide or carbon doped silicon oxide. Then, an etch process may be performed on the liner insulation layer to form a liner layer. The etch process may be performed until the third bonding pad 240 of the second semiconductor chip 200 is exposed. Accordingly, the surface of the third bonding pad 240 of the second semiconductor chip 200 may be exposed by the liner layer.

Then, the third through electrode 350 may be formed in the opening, such that the third through electrode 350 contacts the third bonding pad 240 of the second semiconductor chip 200.

For example, after forming a barrier metal layer on the liner layer 352, a seed layer may be formed on the barrier metal layer. Then, a conductive layer may be formed on the seed layer to fill the opening.

The barrier metal layer may be formed to include a metal nitride, e.g., titanium nitride, tantalum nitride, or the like and/or a metal, e.g., titanium, tantalum, or the like. A physical vapor deposition process may be performed to deposit a copper layer as the seed layer. The conductive layer may include a metal such as copper.

Then, a chemical mechanical polish process may be performed on the conductive layer, the barrier metal layer and the liner layer to form the third through electrode 350 as a through silicon via.

Then, a second insulation interlayer may be formed on the first insulation interlayer. Thus, a third front insulation layer 330 including the first insulation interlayer and the second insulation interlayer may be formed on the first surface 312, that is, the front surface of the third substrate 310.

The second insulation interlayer may include buffer layers and insulation layers stacked alternately on one another. For example, the buffer layers may include silicon nitride, silicon carbon nitride (SiCN), silicon carbon oxynitride (SiCON), or the like. The insulation layers may include silicon oxide, carbon doped silicon oxide, silicon oxynitride (SiCN), or the like.

The second insulation interlayer may include a plurality of wirings therein. The third through electrode 350 formed in the first wafer W1 may be electrically connected to a fifth bonding pad 340 by the wirings. Additionally, the third through electrode 350 may contact a third bonding pad 230 of the second semiconductor chip 200.

Figure 23:
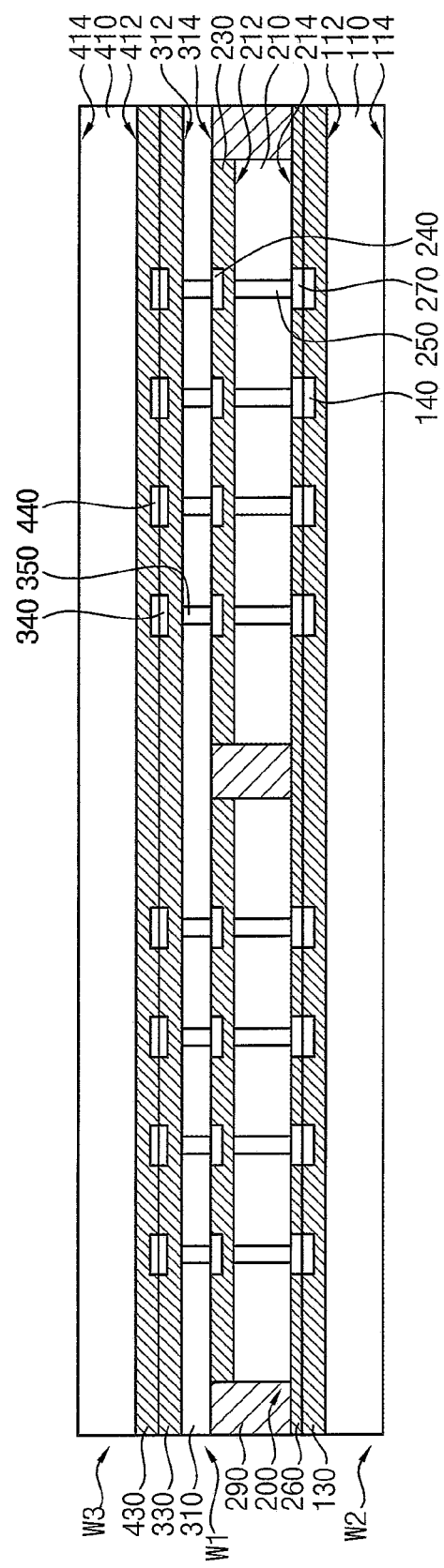

Referring to FIG. 23, processes that are the same as or similar to the processes described with reference to FIGS. 13 to 14 may be performed to stack a third wafer W3 on the third front insulation layer 330 on the first wafer W1.

In some example embodiments, the third wafer W3 may be stacked such that a first surface 412, that is, a front surface of a fourth substrate 410 of the third wafer W3 faces the first surface 312 of the third substrate 310 of the first wafer W1. A seventh bonding pad 440 of the third wafer W3 and the fifth bonding pad 340 of the first wafer W1 may contact each other. The first wafer W1 and the third wafer W3 may be bonded to each other such that the front surface of the first wafer W1 and the front surface of the third wafer W3 face each other (face-to-face bonding). When the third wafer W3 and the first wafer W1 are bonded to each other by wafer-to-wafer bonding, the seventh bonding pad 440 of the third wafer W3 and the fifth bonding pad 340 of the first wafer W1 may be bonded to each other by Cu—Cu Hybrid Bonding.

Then, the first to third wafers W1, W2, and W3 and the filling support layer 290 may be cut along a scribe lane region SA by a sawing process to form individualized semiconductor packages.

Figure 24:
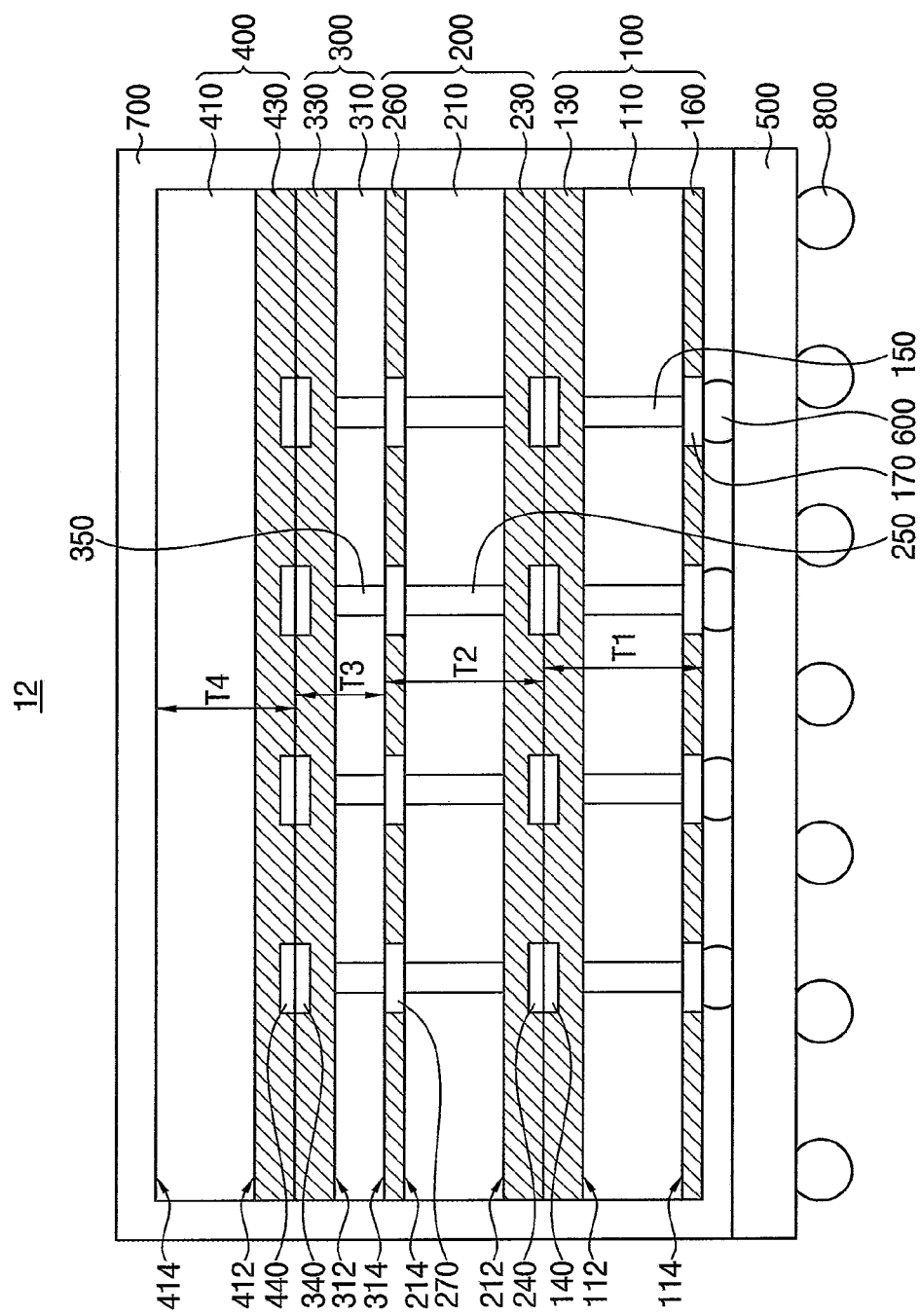

FIG. 24 is a cross-sectional view illustrating aspects of a semiconductor package in accordance with some example embodiments. Some aspects of the semiconductor package illustrated in FIG. 24 may be substantially the same as or similar to aspects of the semiconductor package described with reference to FIGS. 1 to 3, except for configurations of a package substrate and a molding member. Thus, same reference numerals will be used to refer to the same or like elements and any further repetitive explanation concerning the above elements will be omitted for brevity.

Referring to FIG. 24, a semiconductor package 12 may include a package substrate 500, first to fourth semiconductor chips 100, 200, 300, and 400, and a molding member 700. Additionally, the semiconductor package 12 may further include conductive bumps 600 and outer connection members 800.

The package substrate 500 may be a printed circuit board (PCB), which may include circuit patterns therein. Substrate pads may be provided on an upper surface of the package substrate 500, and the outer connection members 800 such as solder balls may be provided on a lower surface of the package substrate 500.

The first to fourth semiconductor chips 100, 200, 300, 400 as described with reference to FIG. 1 may be stacked on the package substrate 500. In some example embodiments, the semiconductor package may be a multi-chip package including four stacked semiconductor chips 100, 200, 300, and 400, as illustrated in FIG. 24. However, the present disclosure is not limited thereto.

The conductive bumps 600 may be interposed between the package substrate 500 and the first semiconductor chip 100. The conductive bump 600 may be electrically connect the substrate pad of the package substrate 500 and the second bonding pad 170 of the first semiconductor chip 100 to each other.

The molding member 700 may be provided on the package substrate 500, and may cover the first to fourth semiconductor chips 100, 200, 300, 400. The molding member 700 may include an epoxy molding compound (EMC) material.

The semiconductor package may include semiconductor devices such as logic devices or memory devices. The semiconductor package may include logic devices such as central processing units (CPUs), main processing units (MPUs), or application processors (APs), or the like. The semiconductor package may include volatile memory devices such as DRAM devices, HBM devices, or the like. The semiconductor package may include non-volatile memory devices such as flash memory devices, PRAM devices, MRAM devices, ReRAM devices, or the like.

The foregoing is illustrative of some example embodiments and is not to be construed as limiting of the inventive concepts provided herein. Although some example embodiments have been described, those skilled in the art will readily appreciate that many modifications are possible in example embodiments without materially departing from the inventive concepts of the present disclosure. Accordingly, all such modifications are intended to be included within the scope of the inventive concepts as defined in the claims.

What is claimed is:

1. A semiconductor package, comprising:
    a first semiconductor chip including a first substrate and a front insulation layer on a front surface of the first substrate and having a first bonding pad in an outer surface thereof;
    a second semiconductor chip stacked on the first semiconductor chip, the second semiconductor chip including a second substrate, a second front insulation layer on a front surface of the second substrate and having a third bonding pad in an outer surface thereof, and a second backside insulation layer on a backside surface of the second substrate and having a fourth bonding pad in an outer surface thereof;
    a third semiconductor chip stacked on the second semiconductor chip, the third semiconductor chip including a third substrate, a third front insulation layer on a front surface of the third substrate and having a fifth bonding pad in an outer surface thereof, and a through electrode penetrating through the third substrate to be electrically connected to the fifth bonding pad; and a fourth semiconductor chip stacked on the third semiconductor chip, the fourth semiconductor chip including a fourth substrate and a fourth front insulation layer on a front surface of the fourth substrate and having a seventh bonding pad in an outer surface thereof, wherein a backside of the third substrate is arranged to face the backside surface of the second substrate such that the third substrate and the second backside insulation layer are bonded directly to each other.

2. The semiconductor package of claim 1, wherein the fourth bonding pad of the second semiconductor chip is bonded directly to the through electrode of the third semiconductor chip exposed from the backside surface of the third substrate.

3. The semiconductor package of claim 1, wherein a front surface of the fourth substrate is arranged to face the front surface of the third substrate.

4. The semiconductor package of claim 3, wherein the fourth front insulation layer of the fourth semiconductor chip and the third front insulation layer of the third semiconductor chip are bonded directly to each other.

5. The semiconductor package of claim 1, wherein a thickness of the third semiconductor chip is smaller than a thickness of the first semiconductor chip, and wherein the thickness of the third semiconductor chip is less than or equal to a thickness of the second semiconductor chip.

6. The semiconductor package of claim 5, wherein the thickness of the third semiconductor chip is within a range of 5 μm to 20 μm.

7. The semiconductor package of claim 5, wherein the thickness of the second semiconductor chip is within a range of 10 μm to 30 μm.

8. The semiconductor package of claim 5, wherein the thickness of the first semiconductor chip is smaller than a thickness of the fourth semiconductor chip.

9. The semiconductor package of claim 1, wherein a thickness of the third semiconductor chip is smaller than thicknesses of each of the first, second and fourth semiconductor chips.

10. A semiconductor package, comprising:
a first semiconductor chip including a first substrate and a front insulation layer on a front surface of the first substrate;
a second semiconductor chip stacked on the first semiconductor chip, the second semiconductor chip including a second substrate, a second front insulation layer on a front surface of the second substrate, and a second backside insulation layer on a backside surface of the second substrate;
a third semiconductor chip stacked on the second semiconductor chip, the third semiconductor chip including a third substrate, a third front insulation layer on a front surface of the third substrate, and a through electrode penetrating through the third substrate; and
a fourth semiconductor chip stacked on the third semiconductor chip, the fourth semiconductor chip including a fourth substrate and a fourth front insulation layer on a front surface of the fourth substrate,
wherein the front surface of the second substrate is arranged to face the front surface of the first substrate,
wherein the front surface of the fourth substrate is arranged to face the front surface of the third substrate,
wherein a backside of the third substrate is arranged to face the backside surface of the second substrate such that the third substrate and the second backside insulation layer are bonded directly to each other, and
wherein the second backside insulation layer has a bonding pad therein, and a thickness of the bonding pad is equal to a thickness of the second backside insulation layer.

11. The semiconductor package of claim 10, wherein the bonding pad is bonded directly to the through electrode of the third semiconductor chip, and wherein the through electrode is exposed from the backside surface of the third substrate.

12. The semiconductor package of claim 10, wherein the fourth front insulation layer and the third front insulation layer are bonded directly to each other.

13. The semiconductor package of claim 10, wherein a thickness of the third semiconductor chip is less than a thickness of the first semiconductor chip, and wherein the thickness of the third semiconductor chip is less than a thickness of the second semiconductor chip.

14. The semiconductor package of claim 13, wherein the thickness of the third semiconductor chip is within a range of 5 μm to 20 μm.

15. The semiconductor package of claim 13, wherein the thickness of the second semiconductor chip is within a range of 10 μm to 30 μm.

16. The semiconductor package of claim 13, wherein the thickness of the first semiconductor chip is less than a thickness of the fourth semiconductor chip.

17. The semiconductor package of claim 10, wherein a thickness of the third semiconductor chip is less than thicknesses of each of the first, second and fourth semiconductor chips.

18. A semiconductor package, comprising:
a package substrate;
first to fourth semiconductor chips sequentially stacked on the package substrate; and
a molding member on the package substrate to cover the first to fourth semiconductor chips,
wherein a front surface of a second substrate of the second semiconductor chip is arranged to face a front surface of a first substrate of the first semiconductor chip,
wherein a front surface of a fourth substrate of the fourth semiconductor chip is arranged to face a front surface of a third substrate of the third semiconductor chip,
wherein a backside surface of the third substrate is arranged to face a backside surface of the second substrate such that the third substrate and a second backside insulation layer provided on the backside surface of the second substrate are bonded directly to each other,
wherein a thickness of the third semiconductor chip is within a range of 5 μm to 20 μm, and a thickness of the second semiconductor chip is within a range of 10 μm to 30 μm, and
wherein the thickness of the third semiconductor chip is less than the thickness of the second semiconductor chip.

* * * * *